(12) United States Patent
Fujikura et al.

(10) Patent No.: US 11,631,785 B2
(45) Date of Patent: *Apr. 18, 2023

(54) GROUP-III NITRIDE LAMINATED SUBSTRATE AND SEMICONDUCTOR LIGHT-EMITTING ELEMENT

(71) Applicant: SUMITOMO CHEMICAL COMPANY, LIMITED, Tokyo (JP)

(72) Inventors: Hajime Fujikura, Hitachi (JP); Taichiro Konno, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 147 days.

This patent is subject to a terminal disclaimer.

(21) Appl. No.: 16/952,699

(22) Filed: Nov. 19, 2020

(65) Prior Publication Data

US 2021/0217927 A1 Jul. 15, 2021

(30) Foreign Application Priority Data

Nov. 22, 2019 (JP) .............................. JP2019-211371

(51) Int. Cl.
*H01L 33/32* (2010.01)
*H01L 33/00* (2010.01)
*C30B 29/40* (2006.01)

(52) U.S. Cl.
CPC ............ *H01L 33/32* (2013.01); *C30B 29/406* (2013.01); *H01L 33/007* (2013.01); *H01L 33/0075* (2013.01)

(58) Field of Classification Search
CPC ... C30B 29/406; H01L 33/32; H01L 33/0075; H01L 33/007; H01L 33/025
See application file for complete search history.

(56) References Cited

U.S. PATENT DOCUMENTS

| 9,293,539 B2 * | 3/2016 | Sakaguchi .......... H01L 29/2003 |
| 2011/0163349 A1 * | 7/2011 | Sakai .................. H01L 21/0262 438/46 |
| 2013/0247817 A1 | 9/2013 | Konno et al. |
| 2014/0264363 A1 * | 9/2014 | Zhu .................. H01J 37/32467 438/93 |
| 2016/0268130 A1 * | 9/2016 | Sugiyama ......... H01L 21/02505 |

(Continued)

FOREIGN PATENT DOCUMENTS

JP 2013-225648 A 10/2013

*Primary Examiner* — Savitri Mulpuri
(74) *Attorney, Agent, or Firm* — Foley & Lardner LLP

(57) ABSTRACT

A group III-nitride laminated substrate includes a sapphire substrate, a first layer that is formed on the sapphire substrate and is made of aluminum nitride, a second layer that is formed on the first layer and serves as an n-type layer made of gallium nitride and doped with an n-type dopant, a third layer that is formed on the second layer and serves as a light-emitting layer made of a group III-nitride, and a fourth layer that is formed on the third layer and serves as a p-type layer made of a group III-nitride and doped with a p-type dopant. The second layer has a thickness of 7 μm or less. A half-value width of (0002) diffraction determined through X-ray rocking curve analysis is 100 seconds or less, and a half-value width of (10-12) diffraction determined through X-ray rocking curve analysis is 200 seconds or less.

14 Claims, 11 Drawing Sheets

(56) References Cited

U.S. PATENT DOCUMENTS

| | | | |
|---|---|---|---|
| 2017/0141269 A1* | 5/2017 | Konno | H01L 33/18 |
| 2018/0158680 A1* | 6/2018 | Fujikura | H01L 21/02502 |
| 2020/0259046 A1* | 8/2020 | Fujikura | C30B 29/403 |
| 2021/0151625 A1* | 5/2021 | Konno | H01L 33/20 |
| 2021/0184080 A1* | 6/2021 | Fujikura | H01L 21/02433 |
| 2021/0210602 A1* | 7/2021 | Meguro | H01L 21/02587 |
| 2022/0028981 A1* | 1/2022 | Fujikura | H01L 21/02505 |

\* cited by examiner

GROUP-III NITRIDE LAMINATED SUBSTRATE AND SEMICONDUCTOR LIGHT-EMITTING ELEMENT

CROSS-REFERENCE TO RELATED APPLICATIONS

The present application claims priority to and the benefit of Japanese Patent Application No. 2019-211371, filed on Nov. 22, 2019. The contents of these applications are hereby incorporated by reference in their entireties.

BACKGROUND

Technical Field

The present invention relates to a group III-nitride laminated substrate, and a semiconductor light-emitting element.

Description of Related Art

A group III-nitride laminated substrate (also referred to as a "wafer" hereinafter) obtained by forming a GaN layer on an underlying substrate constituted by a substrate made of a different type of material such as a sapphire substrate is used as a material for manufacturing a semiconductor element such as a light-emitting diode (LED) (see Patent Document 1, for example). Influences due to a decrease in the precision of lithography caused by warping of a wafer are increasing, for example, due to further increases in the diameter of the wafer and further decreases in the size of a semiconductor element.

A micro LED display, which is a display with lower power consumption and higher image quality, is proposed as an alternative to a liquid crystal display and an organic EL display. Conventional semiconductor light-emitting elements (LED chips) used for illumination and the like have a size of several hundred micrometers square to several millimeters square, whereas semiconductor light-emitting elements (LED chips) used for micro LED displays are required to have an extremely small size of one hundred or less micrometers square. Hereinafter, semiconductor light-emitting elements used for micro LED displays are also referred to as "micro LEDs". When forming micro LEDs, lithography needs to be performed with higher precision compared with the formation of conventional LEDs. Accordingly, it is desirable that a decrease in the precision of lithography caused by warping of a wafer is suppressed.

It is conceivable to reduce the thickness of a GaN layer formed on an underlying substrate in order to reduce warping of a wafer. However, there is a concern that the quality of the GaN layer (e.g., crystallizability) will deteriorate due to the reduction in the thickness of the GaN layer. Therefore, a technology capable of forming a GaN layer that is of high quality despite its small thickness is in demand.

PATENT DOCUMENTS

Patent Document 1: JP 2013-225648A

SUMMARY OF INVENTION

Technical Problem

It is an object of the present invention to provide a technology capable of improving the quality of a GaN layer that is formed on a sapphire substrate and is to be used in a semiconductor light-emitting element.

Solution to Problem

An aspect of the present invention provides a group III-nitride laminated substrate including:
a sapphire substrate;
a first layer that is formed on the sapphire substrate and is made of aluminum nitride;
a second layer that is formed on the first layer and serves as an n-type layer made of gallium nitride and doped with an n-type dopant;
a third layer that is formed on the second layer and serves as a light-emitting layer made of a group III-nitride; and
a fourth layer that is formed on the third layer and serves as a p-type layer made of a group III-nitride and doped with a p-type dopant,
wherein the second layer has a thickness of 7 μm or less, a half-value width of (0002) diffraction determined through X-ray rocking curve analysis is 100 seconds or less, and a half-value width of (10-12) diffraction determined through X-ray rocking curve analysis is 200 seconds or less.

Another aspect of the present invention provides a semiconductor light-emitting element including
the second layer included in the group III-nitride laminated substrate according to the above-mentioned aspect as an n-type layer.

Advantageous Effects of Invention

Provided is a technology capable of improving the quality of a GaN layer that is formed on a sapphire substrate and is to be used in a semiconductor light-emitting element.

DESCRIPTION OF EMBODIMENTS

Embodiment

A group III-nitride laminated substrate 150 (also referred to as a "wafer 150" hereinafter) according to an embodiment of the present invention and a semiconductor light-emitting element 200 (also referred to as a "light-emitting element 200" hereinafter) manufactured using the wafer 150 will be described. The wafer 150 is a laminated substrate that is used as part of a light-emitting diode (LED).

Figure 1:
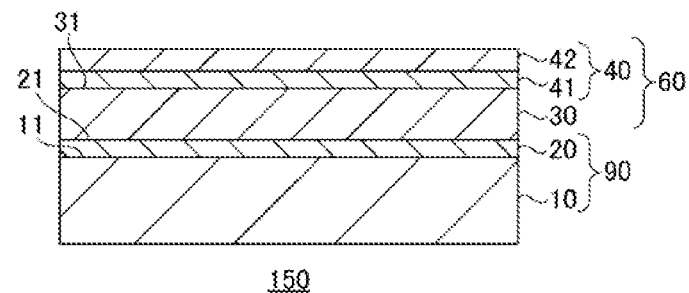
FIG. 1 is an illustrative schematic cross-sectional view of a wafer according to an embodiment of the present invention.

FIG. 1 is an illustrative schematic cross-sectional view of the wafer 150. The wafer 150 includes a sapphire substrate 10, an AlN layer 20 made of aluminum nitride (AlN), a GaN layer 30 that is an n-type layer made of gallium nitride (GaN) and doped with an n-type dopant, a light-emitting layer 41 made of a group III-nitride, and a p-type layer 42 made of a group III-nitride and doped with a p-type dopant. As described in detail below, one of the features of the wafer 150 according to this embodiment is that the GaN layer 30 grown directly on the AlN layer 20 is of high quality despite its small thickness.

A sapphire substrate including a principal surface 11 that is a surface inclined to the C surface at an angle of 0.1° or more and 0.6° or less in the a axis direction or them axis direction is preferably used as the sapphire substrate 10. It should be noted that the sapphire substrate 10 may be a flat substrate that is not a patterned sapphire substrate (PSS) and has a flat principal surface 11.

In order to improve the productivity when manufacturing the light-emitting element 200 using the wafer 150, it is preferable to use a sapphire substrate 10 having a large area with which many light-emitting elements 200 can be formed in its surface. The diameter of the sapphire substrate 10 is preferably 2 inches (50.8 mm) or more, more preferably 4 inches (100 mm) or more, and even more preferably 6 inches (150 mm) or more. The thickness of the sapphire substrate 10 having a diameter of 2 inches is 300 µm or more and 500 µm or less (typically 430 µm), for example, the thickness of the sapphire substrate 10 having a diameter of 4 inches is 600 µm or more and 1000 µm (typically 900 µm), for example, and the thickness of the sapphire substrate 10 having a diameter of 6 inches is 1000 µm or more and 1500 µm or less (typically 1300 µm), for example.

The AlN layer 20 is formed on the sapphire substrate 10. More specifically, the AlN layer 20 is formed by being heteroepitaxially grown on the principal surface 11 of the sapphire substrate 10 (directly on the principal surface 11 so as to be in contact with the principal surface 11). The AlN layer 20 functions as a nucleation layer for growing the GaN layer 30.

In order to improve the crystallizability of the AlN layer 20, the thickness of the AlN layer 20 is preferably 0.1 µm or more. Also, in order to suppress the generation of cracks in the AlN layer 20 and reduce warping of the wafer 150, the thickness of the AlN layer 20 is preferably 1 µm or less.

Specifically, it is preferable that the AlN layer 20 has high crystallizability as described below. The half-value width of the X-ray rocking curve of the (0002) face of the AlN layer 20 is preferably 100 seconds or less, and the half-value width of the X-ray rocking curve of the (10-12) face of the AlN layer 20 is preferably 300 seconds or less. A surface 21 of the AlN layer 20 preferably has Al-polarity. It should be noted that, in this specification, the term "half-value width" means the full width at half maximum (FWHM).

The GaN layer 30 is formed on the AlN layer 20. More specifically, the GaN layer 30 is formed by being heteroepitaxially grown on the surface 21 of the AlN layer 20 (directly on the surface 21 so as to be in contact with the surface 21). That is, the GaN layer 30 is formed on the sapphire substrate 10 via the AlN layer 20. Details of the characteristics of the GaN layer 30 will be described later.

The light-emitting layer 41 is formed on the GaN layer 30. More specifically, the light-emitting layer 41 is formed by being heteroepitaxially grown on a surface 31 of the GaN layer 30 (directly on the surface 31 so as to be in contact with the surface 31). The light-emitting layer 41 is made of a group III-nitride, and the configurations of the light-emitting layer 41 such as the laminated structure and the composition may be selected as appropriate in accordance with the wavelength of light to be emitted from the light-emitting element 200. For example, a light-emitting layer 41 for emitting light of a wavelength of 445 nm is configured to have a multiple quantum well structure obtained by alternately stacking indium gallium nitride (InGaN) well layers and GaN barrier layers, and specifically has a structure obtained by alternately growing an InGaN well layer having a thickness of 2 to 4 nm and a GaN barrier layer having a thickness of 8 to 30 nm and repeating this cycle 5 to 50 times, for example.

The p-type layer 42 is formed on the light-emitting layer 41. The p-type layer 42 is made of a group III-nitride, and the configurations of the p-type layer 42 such as the laminated structure and the composition may be selected as appropriate in accordance with the configuration and the like of the light-emitting layer 41. For example, the p-type layer 42 is formed by stacking a p-type aluminum gallium nitride (AlGaN) clad layer having a thickness of 10 to 50 nm and a p-type GaN contact layer having a thickness of 200 to 500 nm.

A combined layer of the light-emitting layer 41 and the p-type layer 42 is also referred to as a group III-nitride layer 40. The group III-nitride layer 40 is formed on the surface 31 of the GaN layer 30 by heteroepitaxially growing a group III-nitride. In order to reduce warping of the wafer 150, the thickness of the group III-nitride layer 40 is preferably 1 μm or less and more preferably 500 nm or less.

The characteristics of the GaN layer 30 will be described in detail. The GaN layer 30 according to this embodiment is of high quality as described below.

Crystallizability of GaN Layer

The GaN layer 30 has high crystallizability. Specifically, the thickness of the GaN layer 30 is 7 μm or less, the half-value width of the (0002) face thereof determined through the X-ray rocking curve analysis is 100 seconds or less, and the half-value width of the (10-12) face thereof determined through the X-ray rocking curve analysis is 200 seconds or less. As described in Examples, which will be described later, reducing the thickness of the GaN layer 30 to 7 μm or less makes it possible to improve the total yield of the light-emitting element 200, and is thus preferable.

Conventionally, when a GaN layer having improved crystallizability is formed on a sapphire substrate via an AlN layer, a GaN layer is grown to have a large thickness of about 10 μm or more, for example. The reason for this is that the thicker a grown GaN layer is, the higher the crystallizability of the GaN layer is. However, in a case where a GaN layer is formed using a common method, even if the GaN layer has a large thickness of 10 μm, the half-value width of the X-ray rocking curve of the (0002) face of the GaN layer is only reduced to about 200 seconds, and the half-value width of the X-ray rocking curve of the (10-12) face of the GaN layer is only reduced to about 300 seconds (see FIG. 15).

Figure 5:
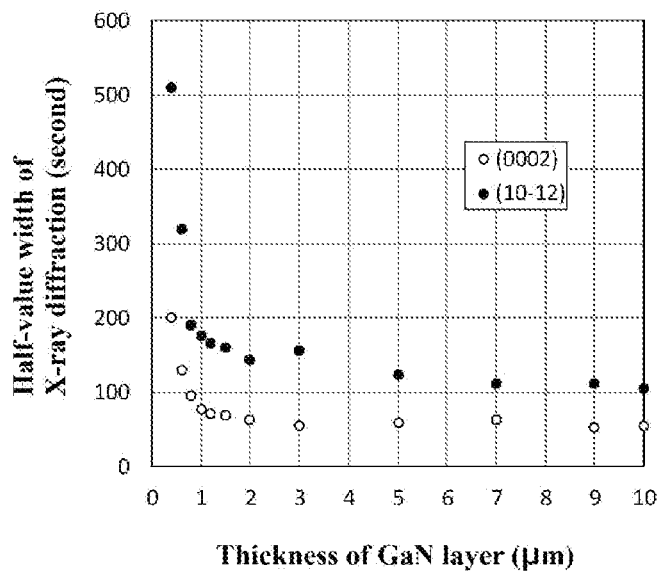
FIG. 5 is a graph showing the crystallizability of GaN layers according to a working example.

On the other hand, although the GaN layer 30 according to this embodiment has a thickness of 7 μm or less, it has high crystallizability as defined by the half-value width of the X-ray rocking curve of the (0002) face thereof being 100 seconds or less, and the half-value width of the X-ray rocking curve of the (10-12) face thereof being 200 seconds or less (see FIG. 5).

It should be noted that the crystallizability of the GaN layer 30 is likely to decrease as the thickness of the GaN layer 30 decreases, that is, the crystallizability of the GaN layer 30 is likely to increase as the thickness of the GaN layer 30 increases. Increasing the thickness of the GaN layer 30 to 0.8 μm or more makes it possible to reduce the half-value width of the (0002) face thereof to 100 seconds or less and the half-value width of the (10-12) face thereof to 200 seconds or less (see FIG. 5). Increasing the thickness of the GaN layer 30 to 1 μm or more makes it possible to reduce the half-value width of the (0002) face thereof to 80 seconds or less and the half-value width of the (10-12) face thereof to 180 seconds or less. Moreover, increasing the thickness of the GaN layer 30 to 1.5 μm or more makes it possible to reduce the half-value width of the (0002) face thereof to 70 seconds or less and the half-value width of the (10-12) face thereof to 170 seconds or less.

Surface Flatness of GaN Layer

The GaN layer 30 has high surface flatness. Specifically, when a root mean square (rms) value determined through measurement of a 5-μm square region using an atomic force microscope (AFM) is taken as surface roughness, the surface 31 of the GaN layer 30 preferably has a surface roughness of 0.5 nm or less, and more preferably has a surface roughness of 0.4 nm or less (see FIG. 6).

It should be noted that the surface flatness of the GaN layer 30 is likely to rapidly deteriorate when the GaN layer 30 has an excessively small thickness. Setting the thickness of the GaN layer 30 to 0.8 μm or more makes it possible to achieve high surface flatness as described above (see FIG. 6).

In-Plane Uniformity of Thickness of GaN Layer

The GaN layer 30 has high in-plane thickness uniformity. Specifically, when the GaN layer 30 has a thickness of 7 μm or less, the in-plane fluctuation in the thickness of the GaN layer 30 is 3.5% or less (more preferably 3% or less) (see FIG. 7). The in-plane fluctuation in the thickness of the GaN layer 30 is defined as follows. A lattice of squares arranged at regular intervals (preferably, at intervals of 1 mm or more and 2 mm or less) is set on the surface of a measurement-target wafer, and the thickness of the GaN layer 30 is measured at every lattice point. As a method for measuring the thickness of the GaN layer 30 at each point, it is preferable to use a method in which a cross section is observed using an electron microscope or the like, a spectroscopic ellipsometry, or the like. It should be noted that, in many cases, correct measurement results are not obtained due to the influence of the beveled shape of the end of the wafer, the influence of irregular reflection of light, and the like. In such cases, it is preferable not to use, in the following calculation, measurement data obtained from measurement points arranged between the end of the wafer and a position about 1 to 3 mm away from the edge of the wafer. In this specification, the intervals between the lattice points are set to 1 mm, an average value and a standard deviation are determined using thickness measurement data excluding measurement data obtained from the region between the outer periphery of a wafer and a position 2 mm away from the outer periphery of the wafer, and a value (%) obtained by dividing the standard deviation by the average value is taken as the in-plane fluctuation in the thickness.

In-Plane Uniformity of Dopant Concentration in GaN Layer

The GaN layer 30 has high in-plane n-type dopant concentration uniformity. Specifically, when the GaN layer 30 has a thickness of 7 μm or less, the in-plane fluctuation in the n-type dopant concentration in the GaN layer 30 is 3.5% or less (more preferably 3% or less) (see FIG. 8). In response to this, the in-plane fluctuation in the n-type carrier concentration in the GaN layer 30 can be reduced to 3.5% or less (more preferably 3% or less) (see FIG. 8). Hereinafter, the n-type dopant concentration in the GaN layer 30 is also referred to as merely a "dopant concentration", and the n-type carrier concentration in the GaN layer 30 is also referred to merely as a "carrier concentration".

The in-plane fluctuation in the dopant concentration and the in-plane fluctuation in the carrier concentration in the GaN layer 30 are defined as follows. Secondary ion mass spectrometry (SIMS) is commonly used to measure the dopant concentration. Capacitance-voltage measurement (CV measurement), Hall measurement, and the like are commonly used to measure the carrier concentration. The dopant concentration and the carrier concentration are measured on coordinate axes set as orthogonal coordinate axes that are located on the surface of a measurement-target wafer and pass through the center of the wafer. It is preferable that one axis of the orthogonal coordinates extends in the same direction as the off-direction of the wafer. In this specification, an average value and a standard deviation are determined using SIMS measurement data obtained from positions located on the orthogonal coordinate axes at intervals of 1 cm, and a value (%) obtained by dividing the standard deviation by the average value is taken as the in-plane fluctuation in the dopant concentration. Moreover, an average value and a standard deviation are determined using CV measurement data or Hall measurement data obtained from positions located on the orthogonal coordinate axes at intervals of 1 cm, and a value (%) obtained by dividing the standard deviation by the average value is taken as the in-plane fluctuation in the carrier concentration. As in the case of the thickness measurement described above, when some measurement points are arranged between the outer periphery of a wafer and a position 2 mm away from the outer periphery of the wafer in the measurements of the dopant concentration and the carrier concentration, measurement data obtained from such measurement points is also not used in the calculation mentioned above. It should be noted that, although the methods have been described in which the fluctuation in the dopant concentration and the fluctuation in the carrier concentration are respectively determined by directly measuring the dopant concentration and the carrier concentration, when a dopant (conductive dopant) for controlling the carrier concentration is added, the fluctuation in the carrier concentration may be estimated from the fluctuation in the dopant concentration, or, conversely, the fluctuation in the dopant concentration may be estimated from the fluctuation in the carrier concentration.

As described above, the GaN layer 30 according to this embodiment has (at least one of, preferably two or more of, more preferably three or more of, and even more preferably all four of) high crystallizability, high surface flatness, high in-plane thickness uniformity, and high in-plane dopant concentration (carrier concentration) uniformity, and thus is of high quality.

Warping of Wafer

The wafer 150 warps due to a difference between the thermal expansion coefficients of the sapphire substrate 10 and the GaN layer 30 and the like stacked on the sapphire substrate 10. The larger the thickness of the GaN layer 30 is, the more significantly warped the wafer 150 is. In order to suppress defects such as a decrease in precision of lithography caused by warping when many light-emitting elements are manufactured on the wafer 150, it is preferable that the wafer 150 is not excessively warped.

Figure 9:
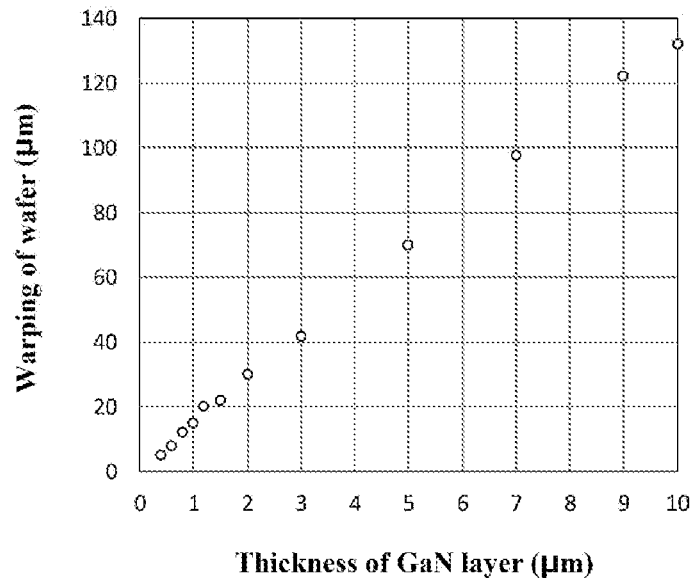
FIG. 9 is a graph showing warping of intermediate wafers according to the working example.

With the wafer 150 according to this embodiment, the thickness of the GaN layer 30 is reduced to 7 μm or less (and the thicknesses of the AlN layer 20 and the group III-nitride layer 40 are not made excessively large), thus making it possible to reduce the warping of the wafer 150 to 110 μm or less (see FIG. 9). It is preferable to select the diameter and the thickness of the sapphire substrate 10 as appropriate such that the warping is suppressed as described above. Examples of the diameter and the thickness of the sapphire substrate 10 include the values as described above.

The warping of the wafer 150 is defined as follows. A measurement-target wafer is placed on a flat surface plate or stage, and a distance (height) from the surface of the surface plate or stage to the surface of the wafer is measured. Orthogonal coordinates passing through the center of the wafer are set on the surface of the wafer, and the measurement is performed on this coordinate axes. It is preferable that one axis of the orthogonal coordinates extends in the same direction as the off-direction of the wafer. In this specification, the above-mentioned height is measured at positions located at intervals of 1 mm on the orthogonal coordinate axes. As in the case of the thickness measurement described above, when some measurement points are arranged between the outer periphery of a wafer and a position 2 mm away from the outer periphery of the wafer, measurement data obtained from such measurement points is not used in the calculation below. A straight line passing through two points of the outermost periphery on each axis is taken as a new reference line, and a distance between the reference line and a measurement point that is located on the axis and is the farthest from the reference line is defined as warping for this axis. This measurement is performed for the two orthogonal axes, and an average value of the values obtained from warping for the two axes is taken as the warping of the wafer.

Figure 2:
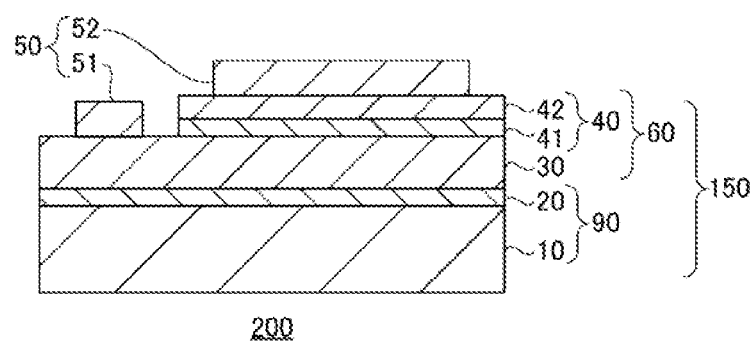
FIG. 2 is a schematic cross-sectional view of a first example of a semiconductor light-emitting element according to an embodiment.
Figure 3:
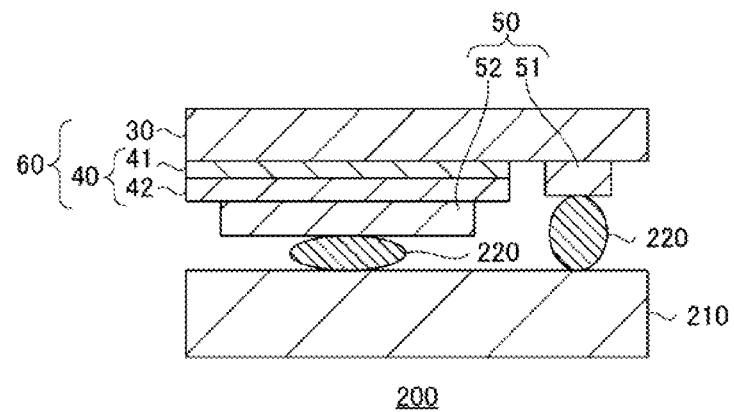
FIG. 3 is a schematic cross-sectional view of a second example of the semiconductor light-emitting element according to the embodiment.

FIG. 2 and FIG. 3 are schematic cross-sectional views showing a first example and a second example of the light-emitting element 200, respectively, and each of the figures illustrates one divided light-emitting element 200 among many light-emitting elements 200 formed on the wafer 150.

The GaN layer 30, which is an n-type layer, the light-emitting layer 41, and the p-type layer 42 make up an operating layer 60 of an LED in which an operating current flows. The light-emitting element 200 includes at least the operating layer 60 and an electrode 50. The electrode 50 includes an n-side electrode 51 that is electrically connected to the GaN layer 30, which is an n-type layer, and a p-side electrode 52 that is electrically connected to the p-type layer 42. In this example, the n-side electrode 51 is formed on the surface of the GaN layer 30 exposed from the bottom of a recessed portion formed by removing a partial region of the p-type layer 42 and the light-emitting layer 41 over the entire thickness thereof. The p-side electrode 52 is formed on the surface of the p-type layer 42. The materials, arrangement, structure, and the like of the n-side electrode 51 and the p-side electrode 52 may be appropriately selected as needed.

The light-emitting element 200 of the first example shown in FIG. 2 includes the sapphire substrate 10 as a support substrate, and includes the AlN layer 20 between the sapphire substrate 10 and the GaN layer 30. In the light-emitting element 200 of the second example shown in FIG. 3, the n-side electrode 51 and the p-side electrode 52 are respectively connected to a circuit board 210 via bumps 220, and the circuit board 210 functions as a support substrate. In the light-emitting element 200 of the second example, the sapphire substrate 10 is omitted. It should be noted that the AlN layer 20 may be omitted following the omission of the sapphire substrate 10.

The size of one light-emitting element 200 in a plan view is 10-μm square or more and 3000-μm square (3-mm square) or less, for example, namely, on an area basis, 100 μm$^2$ or more and 9000000 μm$^2$ (9 mm$^2$) or less, for example. In a case where size reduction is desired for the application to micro LEDs and the like, the size of one light-emitting element 200 in a plan view is preferably 100-μm square or less, for example, namely, on an area basis, 10000 μm$^2$ or less, for example. It should be noted that the shape of the light-emitting element 200 in a plan view is not limited to a square shape and may be appropriately selected as needed.

The GaN layer 30 included in the light-emitting element 200 according to this embodiment is of high quality despite its small thickness (7 μm or less at most). As a result, the following effects are obtained, for example.

The GaN layer 30 has high crystallizability and high surface flatness despite its small thickness. This makes it possible to improve the crystallizability of the group III-nitride layer 40 grown on the GaN layer 30 despite the small thickness of the GaN layer 30, thus making it possible to improve the performance of the light-emitting element 200.

The GaN layer 30 has high in-plane thickness uniformity. This makes it possible to suppress the fluctuation in performance between many light-emitting elements 200 formed on the wafer 150.

The GaN layer 30 has high in-plane dopant concentration (carrier concentration) uniformity. This makes it possible to suppress the fluctuation in performance between many light-emitting elements 200 formed on the wafer 150.

The GaN layer 30 is of high quality despite the addition of an n-type dopant thereto (over the entire thickness), and can thus be used as at least a portion of the operating layer 60 of the light-emitting element 200. It should be noted that even an aspect of the light-emitting element 200 in which the sapphire substrate 10 (and the AlN layer 20) is removed as in the case of the second example includes the GaN layer 30 as at least a portion of the operating layer 60. It should be noted that a laminated structure in which a portion on the lower layer side (sapphire substrate side) of the GaN layer 30 is undoped, and a portion on the upper layer side (light-emitting layer side) is doped with an n-type dopant may also be employed as needed.

In order to suppress defects such as a decrease in precision of lithography caused by warping of the wafer 150 when many light-emitting elements 200 are formed on the wafer 150, it is preferable that the wafer 150 is not excessively warped. The GaN layer 30 included in the light-emitting element 200 of this embodiment has high crystallizability despite its small thickness. Accordingly, warping of the wafer 150 can be suppressed by reducing the thickness of the GaN layer 30, thus making it possible to suppress defects such as a decrease in precision of lithography caused by the warping. That is, it is possible to suppress the fluctuation in performance between many light-emitting elements 200 formed on the wafer 150.

Specifically, reducing the thickness of the GaN layer 30 to 7 μm or less makes it possible to reduce the warping of the wafer 150 to 110 μm or less. Moreover, as described later in detail in Examples, reducing the thickness of the GaN layer 30 to 5 μm or less makes it possible to reduce the warping of the wafer 150 to 80 μm or less, and reducing the thickness of the GaN layer 30 to 3 μm or less makes it possible to reduce the warping of the wafer 150 to 50 or less.

When manufacturing micro LEDs, it is more important to suppress a decrease in precision of lithography caused by the above-described warping, and it is preferable to reduce the warping of the wafer 150 to 100 μm or less (i.e., reduce the thickness of the GaN layer 30 to 5 μm or less), and it is more preferable to reduce the warping of the wafer 150 to 50 μm or less (i.e., reduce the thickness of the GaN layer 30 to 3 μm or less).

More specifically, with this embodiment, it is possible to suppress the fluctuation in characteristics such as a light emission output, which will be evaluated in Examples later, between many light-emitting elements 200 formed on the wafer 150. The evaluation of these characteristics will be described later in detail in Examples.

Figure 4:
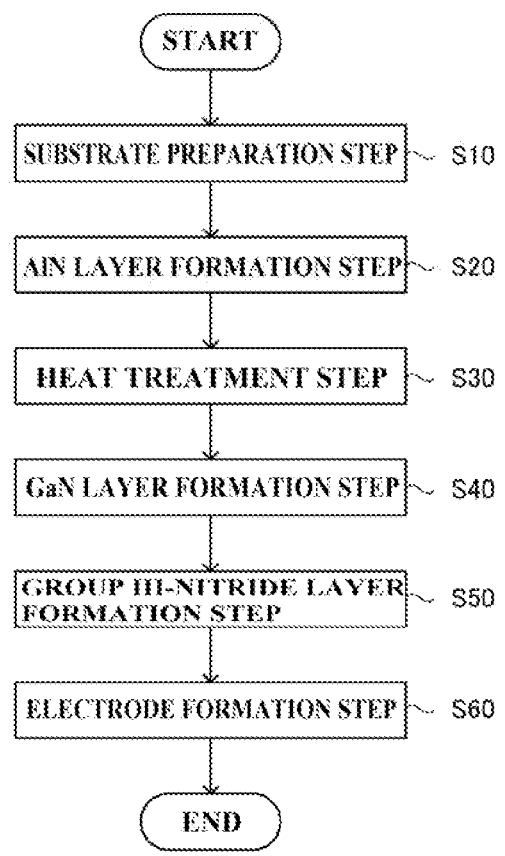
FIG. 4 is a flowchart showing an example of a method for manufacturing a semiconductor light-emitting element according to an embodiment.

Next, a method for manufacturing the light-emitting element 200 will be described. FIG. 4 is a flowchart showing an example of a method for manufacturing the light-emitting element 200 according to this embodiment. The manufacturing method of this example includes a substrate preparation step S10, an AlN layer formation step S20, a heat treatment step S30, a GaN layer formation step S40, a group III-nitride layer formation step S50, and an electrode formation step S60.

In this example, a group III-nitride laminated substrate 90 (also referred to as a "wafer 90" hereinafter) serving as an AlN template in which the AlN layer 20 is located on the outermost surface is manufactured by performing the substrate preparation step S10, the AlN layer formation step S20, and the heat treatment step S30. After the wafer (AlN template) 90 has been manufactured, the wafer 150 is manufactured by performing the formation of the GaN layer 30 in the GaN layer formation step S40 and the formation of the group III-nitride layer 40 in the group III-nitride layer formation step S50 as a series of crystal growth (e.g., crystal growth using a metal-organic vapor phase epitaxy (MOVPE) technique).

First, the sapphire substrate 10 is prepared in the substrate preparation step S10. Next, in the AlN layer formation step S20, the AlN layer 20 is formed on the principal surface 11 of the sapphire substrate 10 by growing AlN thereon. Hydride vapor phase epitaxy (HVPE) is used as a method for growing the AlN layer 20, for example. Aluminum monochloride (AlCl) gas or aluminum trichloride ($AlCl_3$) gas is used as an aluminum (Al) source gas, for example. Ammonia ($NH_3$) gas is used as a nitrogen (N) source gas, for example. These source gases may be mixed with a carrier gas using hydrogen gas ($H_2$ gas), nitrogen gas ($N_2$ gas), or a mixed gas thereof, and then be supplied.

The following are examples of conditions for the growth of the AlN layer 20. It should be noted that the V/III ratio refers to a ratio of the supply amount of a group V (N) source gas to the supply amount of a group III (Al) source gas.

Growth temperature: 900 to 1300° C.
V/III ratio: 0.2 to 200
Growth speed: 0.5 to 3000 nm/minute Hydrogen chloride (HCl) gas may be allowed to flow in order to prevent AlN from attaching to a nozzle of a gas supply pipe for introducing various gasses to a growth chamber of an HYPE apparatus. An example of the supply amount of HCl gas is such an amount that a ratio of HCl gas to AlCl gas or $AlCl_3$ gas is 0.1 to 100.

In the AlN layer formation step S20, the AlN layer 20 having high crystallizability as described above can be obtained by controlling the conditions for crystal growth, performing annealing treatment, and so on. Specifically, the crystallizability of the AlN layer 20 can be improved by suitably adjusting the growth conditions (e.g., the temperature, the growth speed, the supply amount of the raw material, and the like) for the growth of the AlN layer 20, for example. Also, the crystallizability of the AlN layer 20 can be improved by performing annealing treatment in an atmosphere containing $N_2$ gas at a temperature of 1400° C. or higher and 1700° C. or lower after growing the AlN layer 20, for example.

It should be noted that, although the crystallizability of the AlN layer 20 can be improved as described above, compressive strain caused by differences in the lattice constant and the thermal expansion coefficient from the sapphire substrate 10 is likely to be introduced to the formed AlN layer 20 in a direction parallel to the surface 21 (e.g., a axis direction).

Next, in the heat treatment step S30, heat treatment is performed on the AlN layer 20. The heat treatment step S30 is performed in an atmosphere containing $H_2$ gas (referred to as an "atmosphere containing hydrogen" hereinafter). $H_2$ gas may be mixed with an inert gas such as $N_2$ gas or argon gas (Ar gas) and then be supplied. The heat treatment may be performed in the growth chamber of the HVPE apparatus or in a separate heat treatment apparatus.

Performing the heat treatment in an atmosphere containing hydrogen makes it possible to reform the surface 21 such that the compressive strain introduced to the surface 21 of the AlN layer 20 is mitigated. Although a mechanism to mitigate the compressive strain is not clear at present, a mechanism is conceivable in which the generation of point defects in the AlN crystal is promoted in the heat treatment step S30 due to the presence of hydrogen gas in the atmosphere. It is conceivable that nitrogen atoms in AlN are linked to hydrogen on the surface of the AlN to produce ammonia and then leave therefrom, and thus many consumed nitrogen-derived pores that can serve as atom-sized voids are formed in the AlN, thus making it possible to mitigate strain of the GaN layer 30 grown on the AlN layer 20.

The heat treatment step S30 is started in a substantially ammonia-free atmosphere. Specifically, the heat treatment step S30 is performed without supplying $NH_3$ gas, for example. If the heat treatment is performed in an atmosphere containing ammonia, the above-described formation of point defects (consumed nitrogen-derived pores) will be suppressed, thus making it difficult to mitigate strain of the GaN layer 30. When the heat treatment is performed in the growth chamber of the HVPE apparatus, there is the possibility of $NH_3$ gas introduced in the AlN layer formation step S20 remaining in the growth chamber, and therefore, it is preferable to discharge (or replace) the gas in the growth chamber before performing the heat treatment. It should be noted that the term "substantially ammonia-free" as used herein means that the partial pressure of $NH_3$ gas in the growth chamber is less than 1% of the total pressure, for example. It should be noted that, although it is conceivable that nitrogen atoms in the AlN are linked to hydrogen on the surface of the AlN to produce ammonia and then leave therefrom in the heat treatment step S30 as described above, the amount of produced free ammonia is very small. Therefore, such ammonia does not cause the partial pressure of $NH_3$ gas in the growth chamber to be 1% or more of the total pressure. Accordingly, the heat treatment step S30 is performed in a substantially ammonia-free atmosphere.

It is preferable to perform the heat treatment step S30 at a temperature (also referred to as a "heat treatment temperature" hereinafter) of 900° C. or higher and 1300° C. or lower, for example. The surface 21 is difficult to reform at a heat treatment temperature of lower than 900° C. On the contrary, setting the heat treatment temperature to 900° C. or higher makes it easy to reform the surface 21. On the other hand, the surface 21 may decompose at a heat temperature of higher than 1300° C. On the contrary, setting the heat treatment temperature to 1300° C. or lower makes it possible to suppress decomposition of the surface 21.

It is preferable to perform the heat treatment step S30 for 10 minutes or more and 120 minutes or less (this time is also referred to as a "heat treatment time" hereinafter), for example. If the heat treatment time is less than 10 minutes, the surface 21 will be difficult to reform. On the contrary, setting the heat treatment time to 10 minutes or more makes it easy to reform the surface 21. On the other hand, if the heat treatment time is more than 120 minutes, the flatness of the surface 21 may be impaired. On the contrary, setting the heat treatment time to 120 minutes or less makes it possible to suppress impairment of the flatness of the surface 21. The heat treatment time is more preferably 30 minutes or more and 90 minutes or less, for example.

The wafer (AlN template) 90 is manufactured by performing the substrate preparation step S10, the AlN layer formation step S20, and the heat treatment step S30.

Next, in the GaN layer formation step S40, the GaN layer 30 is formed by growing GaN on the AlN layer 20 of the wafer 90. The MOVPE technique is used as a method for growing the GaN layer 30, for example. Trimethylgallium ($Ga(CH_3)_3$, TMG) gas is used as a gallium (Ga) source gas, for example. $NH_3$ gas is used as a nitrogen (N) source gas, for example. Silicon (Si) is used as the n-type dopant, for example, and silane ($SiH_4$) gas is used as a Si source gas, for example. These source gases may be mixed with a carrier gas using $H_2$ gas, $N_2$ gas, or a mixed gas thereof, and then be supplied.

The following are examples of conditions for the growth of the GaN layer 30.
Growth temperature: 900 to 1000° C.
V/III ratio: 500 to 8000
Growth speed: 10 to 100 nm/minute The wafer 90 is a laminated substrate in which the AlN layer 20 has high crystallizability as described above and the surface 21 of the AlN layer 20 is reformed through the above-described heat treatment. Accordingly, the wafer 90 is configured as an AlN template in which the GaN layer 30 that is of high quality as described above can be formed on the AlN layer 20. In the GaN layer formation step S40, the above-described GaN layer 30 that is of high quality can be obtained by forming the GaN layer 30 on the AlN layer 20 included in the wafer 90.

The GaN layer 30 is formed at a low temperature of 1000° C. or lower (preferably 950° C. or lower) in the GaN layer formation step S40. This makes it easier to suppress temperature fluctuation in the in-plane direction while growing the GaN layer 30 compared with the case where the GaN layer 30 is formed at a high temperature of higher than 1000° C., thus making it possible to improve the in-plane uniformity of the thickness of the GaN layer 30. It should be noted that, in this embodiment, the AlN layer 20 serving as a base for the growth of the GaN layer 30 has high crystallizability, and therefore, the above-described GaN layer 30 having high crystallizability can be obtained even when the GaN layer 30 is grown at a low temperature of 1000° C. or lower.

Moreover, temperature fluctuation in the in-plane direction while growing the GaN layer 30 is suppressed, thus making it possible to improve the in-plane uniformity of the dopant concentration in the GaN layer 30. This makes it possible to improve the in-plane uniformity of the carrier concentration in the GaN layer 30.

In order to improve the crystallizability of the GaN layer 30 as well as the surface flatness of the GaN layer 30, the thickness of the GaN layer 30 is preferably 0.8 μm or more. The upper limit of the thickness of the GaN layer 30 is preferably 7 μm or less from the viewpoint of improving the total yield of manufacturing of the light-emitting elements 200.

Next, in the group III-nitride layer formation step S50, the group III-nitride layer 40 is formed by growing a group III-nitride on the GaN layer 30. The wafer 150 is thus formed. Forming the group III-nitride layer 40 on the GaN layer 30 that is of high quality makes it possible to improve the quality of the group III-nitride layer 40 and to improve the performance of the light-emitting element 200.

The group III-nitride layer 40 includes the light-emitting layer 41 and p-type layer 42. The light-emitting layer 41 is formed as a multiple quantum well structure obtained by alternately stacking InGaN well layers and GaN barrier layers, for example. The p-type layer 42 is formed as a laminate of a p-type AlGaN clad layer and a p-type GaN contact layer, for example. It should be noted that the configurations of the light-emitting layer 41 and the p-type layer 42 may be selected as appropriate in accordance with the wavelength of light to be emitted from the light-emitting element 200, and the like.

The group III-nitride layer 40 is constituted by a laminate of group III-nitride layers having different compositions. The layers included in the group III-nitride layer 40 may contain at least one of aluminum (Al), gallium (Ga), and indium (In), for example, as a group-III element in accordance with the compositions required for the layers.

The MOVPE technique is used as a method for growing the group III-nitride layer 40, for example. Trimethylaluminum (Al(CH$_3$)$_3$, TMA) gas is used as an Al source gas, for example. Trimethylgallium (Ga(CH$_3$)$_3$, TMG) gas is used as a Ga source gas, for example. Trimethylindium (In(CH$_3$)$_3$, TMI) gas is used as an In source gas, for example. NH$_3$ gas is used as a nitrogen (N) source gas, for example. Magnesium (Mg) is used as a p-type dopant, for example, and cyclopentadienylmagnesium (Cp$_2$Mg) or ethylcyclopentadienylmagnesium (EtCp$_2$Mg) gas is used as a Mg source gas, for example. These source gases may be mixed with a carrier gas using H$_2$ gas, N$_2$ gas, or a mixed gas thereof, and then be supplied. The supply amounts of the source gases are adjusted as appropriate in accordance with the compositions of the layers included in the group III-nitride layer 40 and dopants to be added.

Next, in the electrode formation step S60, the electrode 50 (the n-side electrode 51 and the p-side electrode 52) is formed. It should be noted that a step of forming a recessed portion in which the n-side electrode 51 is to be arranged may be performed as a portion of the electrode formation step S60. The light-emitting elements 200 are thus manufactured. Thereafter, many light-emitting elements 200 formed on the wafer 150 are divided into individual light-emitting elements 200. Moreover, the sapphire substrate 10 (and AlN layer 20) is removed as needed.

Examples

Next, the results of experiments according to the working example of the present invention will be described. The method described in the Embodiment above was used to produce a laminated substrate (also referred to as an "intermediate wafer" hereinafter) including the sapphire substrate 10 (also referred to merely as an "underlying substrate" hereinafter), the AlN layer 20 (also referred to merely as an "AlN layer" hereinafter), and the GaN layer 30 (also referred to merely as a "GaN layer" hereinafter). Moreover, the laminated substrate 150 (also referred to as a "element wafer" hereinafter) was produced by using the method described in Embodiment above to stack the light-emitting layer 41 (also referred to merely as a "light-emitting layer" hereinafter) and the p-type layer 42 (also referred to merely as a "p-type layer" hereinafter) on the GaN layer of the intermediate wafer, and a light-emitting element was produced by forming an electrode.

The intermediate wafer was examined regarding how the crystallizability of the GaN layer, the surface flatness of the GaN layer, the in-plane uniformity of the thickness of the GaN layer, the in-plane uniformity of the dopant concentration (carrier concentration) in the GaN layer, and warping of the intermediate wafer varied depending on a change in thickness of the GaN layer.

Moreover, the light-emitting element formed on the element wafer was examined regarding how the in-plane uniformity of the light emission output, the in-plane uniformity of the light emission wavelength, the in-plane uniformity of the driving voltage, the in-plane uniformity of the reverse-direction leakage current suppressing effect, and the total yield varied depending on a change in thickness of the GaN layer.

A C-face sapphire substrate having a diameter of 4 inches and a thickness of 900 μm was used as the sapphire substrate. The thickness of the AlN layer was set to 0.35 μm. The GaN layer was doped with Si, which serves as an n-type dopant, at a concentration of $3 \times 10^{18}$ cm$^{-3}$ (over the entire thickness). The thickness of the GaN layer was changed to 0.4 μm, 0.6 μm, 0.8 μm, 1 μm, 1.2 μm, 1.5 μm, 2 μm, 3 μm, 5 μm, 7 μm, 9 μm, and 10 μm.

The light-emitting layer was formed as a multiple quantum well structure obtained by alternately stacking an InGaN well layer having a thickness of 3 nm and a GaN barrier layer having a thickness of 12 nm and repeating this cycle 6 times such that the designed value of the light emission wavelength (also referred to as a "reference light emission wavelength" hereinafter) was 445 nm. A laminate of a p-type AlGaN clad layer having a thickness of 30 nm and a p-type GaN contact layer having a thickness of 300 nm was formed as the p-type layer.

Many light-emitting elements were formed on the entire surface of the element wafer and were then divided into individual light-emitting elements, and thus the light-emitting elements were obtained from the element wafer. One light-emitting element had a size of 100-μm square. The light-emitting element is also referred to merely as an "element" hereinafter. The designed value of the driving current (also referred to as a "reference driving current" hereinafter) of each element was set to 20 mA, the designed value of the driving voltage (also referred to as a "reference driving voltage" hereinafter) of each element was set to 3.3 V, and the designed value of the light emission output (also referred to as a "reference light emission output" hereinafter) of each element was set to 10 mW.

The elements were formed at intervals of 20 μm and separated from one another at portions therebetween. Moreover, a region between the outer periphery of the element wafer and a position 2 mm away from the outer periphery of the element wafer was not used for evaluation because the LED characteristics do not satisfy the specifications due to the influences of ununiform growth, an ununiform lithography process, and the like. About five hundred thousand elements could be obtained from the 4-inch wafer. All of the LEDs obtained from one element wafer were subjected to the following measurements.

The light emission output, the light emission wavelength, the driving voltage, and the reverse-direction leakage current of each element were measured as the characteristics thereof. The elements were examined regarding whether or not each of these characteristics satisfied a predetermined condition. Moreover, in order to obtain the total yield, the elements were examined regarding whether or not all of these characteristics satisfied predetermined conditions. The in-plane uniformity of the light emission output, the light emission wavelength, the driving voltage, the reverse-direction leakage current, and the total yield of each element wafer was evaluated based on a ratio of the number of elements in which a characteristic satisfied a predetermined condition to the total number of elements obtained from the element wafer.

Experiments according to a comparative example were also carried out. The comparative example employed a method in which a common GaN buffer layer grown at a low temperature is formed on a sapphire substrate. Specifically, after a sapphire substrate had been placed in an MOVPE apparatus and a gas inside the apparatus had been replaced with nitrogen gas, the temperature of the substrate was set to 1100° C., and then surface cleaning was performed in a hydrogen atmosphere for 10 minutes. Next, the temperature of the substrate was set to a low temperature of 550° C., TMG and ammonia were introduced into the apparatus, and then a GaN buffer layer was grown by 30 nm. Thereafter, the temperature of the substrate was set to 1050° C. while ammonia was fed thereto, and thus a GaN layer 30 similar to those of the working example was grown. The reason why the temperature at which the GaN layer 30 was grown in the comparative example was set to be higher than that in the working example is that it is difficult to form a GaN layer 30 that is of sufficiently high quality by using the method of the comparative example. It should be noted that, in the comparative example, elements capable of sufficiently functioning as LEDs could not be obtained in the case where the thickness of the GaN layer was reduced to less than 1.5 μm.

Hereinafter, the experimental results will be described in more detail. As described later, the thickness of the GaN layer is preferably 7 μm or less from the viewpoint of improving the total yield of the elements. Accordingly, the examples will be described focusing on the case where the thickness of the GaN layer was in a range of 7 μm or less.

Crystallizability of GaN Layer

Figure 15:
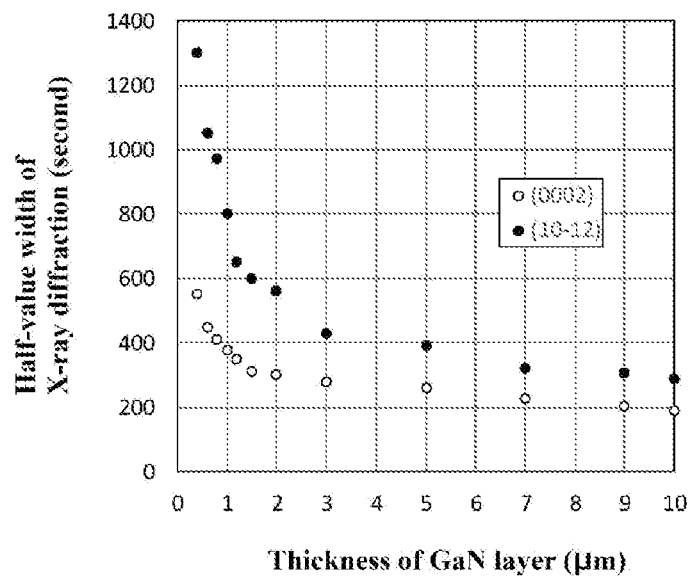
FIG. 15 is a graph showing the crystallizability of GaN layers according to a comparative example.

FIG. 5 is a graph showing the crystallizability of the GaN layers according to the working example, and FIG. 15 is a graph showing the crystallizability of the GaN layers according to the comparative example. In order to evaluate the crystallizability, the half-value width of the (0002) diffraction was measured through X-ray rocking curve analysis, and the half-value width of the (10-12) diffraction was measured through X-ray rocking curve analysis. In FIG. 5 and FIG. 15, the horizontal axis represents the thickness of the GaN layer, and the vertical axis represents the half-value width of X-ray diffraction.

The working example and the comparative example were similar to each other in that the half-value width of X-ray diffraction was likely to decrease as the thickness of the GaN layer was increased, that is, the crystallizability was likely to be improved as the thickness of the GaN layer was increased. However, in the case of the comparative example (FIG. 15), even when the thickness of the GaN layer was increased to 10 μm, the half-value width of the (0002) face was 190 seconds, that is, it was only reduced to about 200 seconds, and the half-value width of the (10-12) face was 290 seconds, that is, it was only reduced to about 300 seconds.

On the contrary, in the case of the working example (FIG. 5), even when the GaN layer had a small thickness of 0.8 μm, the half-value width of the (0002) face was 95 seconds, that is, it was reduced to 100 seconds or less, and the half-value width of the (10-12) face was 190 seconds, that is, it was reduced to 200 seconds or less. In the case of the working example, even when the GaN layer had a thickness of 7 μm or less, increasing the thickness of the GaN layer to 0.8 μm or more made it possible to reduce the half-value width of the (0002) face to 100 seconds or less and the half-value width of the (10-12) face to 200 seconds or less. Furthermore, in the case of the working example, when the thickness of the GaN layer was increased to 7 μm, the half-value width of the (0002) face was 63 seconds, that is, it was reduced to about 60 seconds, and the half-value width of the (10-12) face was 112 seconds, that is, it was reduced to about 110 seconds.

It should be noted that, among the measurement values in the case where the thickness of the GaN layer according to the working example was in a range of 7 μm or less, the minimum value of the half-value width of the (0002) face was 55 seconds obtained from the measurement of the GaN layer having a thickness of 3 μm, and the minimum value of the half-value width of the (10-12) face was 112 seconds obtained from the measurement of the GaN layer having a thickness of 7 μm. When the thickness is in this range, the standard level of the minimum value of the half-value width of the (0002) face is 50 seconds, for example. Moreover, the standard level of the minimum value of the half-value width of the (10-12) face is 105 seconds, for example.

The crystallizability of the GaN layer according to the working example was likely to be significantly improved before the thickness of the GaN layer was increased to about 1.5 μm. When the GaN layer had a thickness of 1 μm, the half-value width of the (0002) face was 76 seconds, that is, it was reduced to 80 seconds or less, and the half-value width of the (10-12) face was 175 seconds, that is, it was reduced to 180 seconds or less. Increasing the thickness of the GaN layer to 1 μm or more made it possible to reduce the half-value width of the (0002) face to 80 seconds or less and the half-value width of the (10-12) face to 180 seconds or less. Moreover, when the GaN layer had a thickness of 1.5 μm, the half-value width of the (0002) face was 68 seconds, that is, it was reduced to 70 seconds or less, and the half-value width of the (10-12) face was 160 seconds, that is, it was reduced to 170 seconds or less. Increasing the thickness of the GaN layer to 1.5 μm or more made it possible to reduce the half-value width of the (0002) face to 70 seconds or less and the half-value width of the (10-12) face to 170 seconds or less.

The GaN layer according to the working example exhibits high crystallizability as described above even when it is doped with a dopant (it is doped with a dopant at a concentration of $1\times10^{16}$ cm$^{-3}$ or more, or $1\times10^{17}$ cm$^{-3}$ or more, or $1\times10^{18}$ cm$^{-3}$ or more, over the entire thickness, for example). Accordingly, it can be said that crystallizability higher than or equal to that in this case is exhibited when the GaN layer is not doped with a dopant. It should be noted that, in order to suppress a decrease in crystallizability, the GaN layer is preferably doped with a dopant at a concentration of $1\times10^{19}$ cm$^{-3}$ or less, for example.

Surface Flatness of GaN Layer

Figure 6:
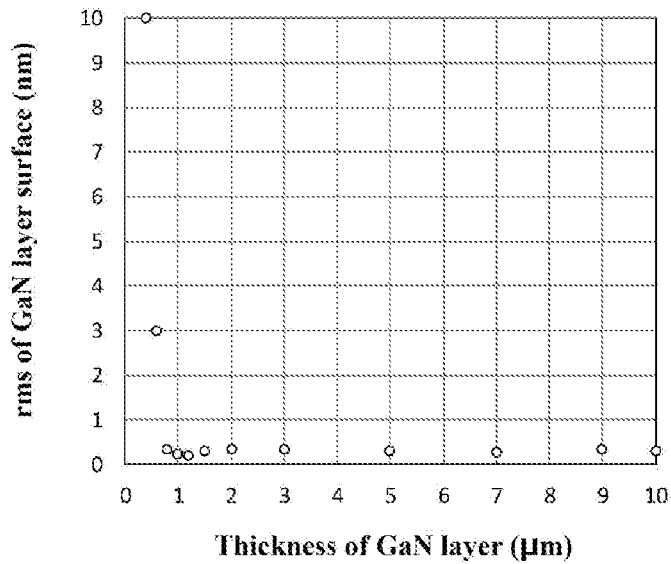
FIG. 6 is a graph showing the surface flatness of the GaN layers according to the working example.
Figure 16:
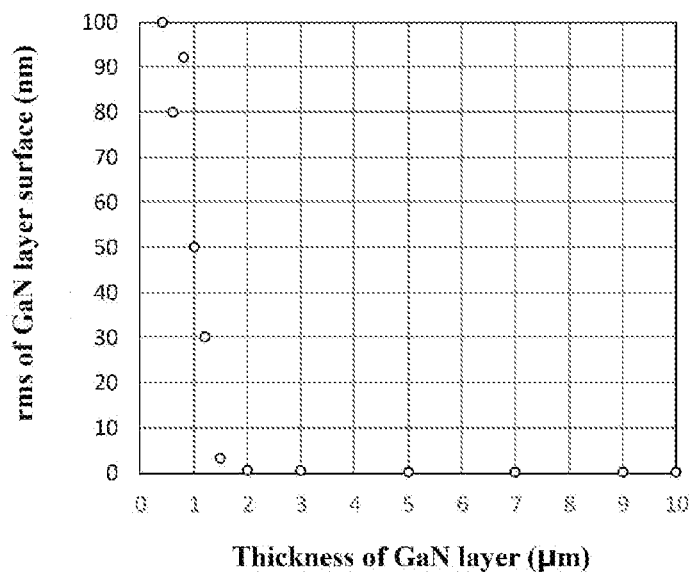
FIG. 16 is a graph showing the surface flatness of the GaN layers according to the comparative example.

FIG. 6 is a graph showing the surface flatness of the GaN layers according to the working example, and FIG. 16 is a graph showing the surface flatness of the GaN layers according to the comparative example. In order to evaluate the surface flatness, an rms value (also referred to merely as an "rms" hereinafter) of the surface roughness of a 5-μm square region on the surface of the GaN layer was determined through a measurement using an AFM. In FIG. 6 and FIG. 16, the horizontal axis represents the thickness of the GaN layer, and the vertical axis represents the rms.

In both cases of the working example and the comparative example, it was likely that the rms sharply decreased before the thickness of the GaN layer was increased to a certain level of thickness, and the rms was substantially constant after the GaN layer had a thickness larger than or equal to that level of thickness. In the case of the comparative example (FIG. 16), although the rms could be reduced to 0.5 nm or less when the GaN layer had a thickness of 2 or more, the rms was 3.1 nm when the GaN layer had a thickness of 1.5 μm, and the rms was 92 nm when the GaN layer had a thickness of 0.8 μm.

On the contrary, in the case of the working example (FIG. 6), the rms was 0.33 nm when the GaN layer had a thickness of 0.8 μm, and increasing the thickness of the GaN layer to 0.8 μm or more made it possible to preferably reduce the rms to 0.5 nm or less, and more preferably 0.4 nm or less. The rms was 3 nm when the GaN layer had a thickness of 0.6 and the rms was 10 nm when the GaN layer had a thickness of 0.4 μm.

It should be noted that, among the measurement values in the case where the thickness of the GaN layer according to the working example was in a range of 7 μm or less, the minimum value of the rms was 0.21 nm obtained from the measurement of the GaN layer having a thickness of 1.2 µm. The standard level of the minimum value of the rms is 0.2 nm, for example.

As described above, the GaN layer according to the working example has higher crystallizability and higher surface flatness compared with the GaN layer according to the comparative example and can thus be favorably used as an underlying layer for growing the group III-nitride layer.

In-Plane Uniformity of Thickness of GaN Layer

Figure 7:
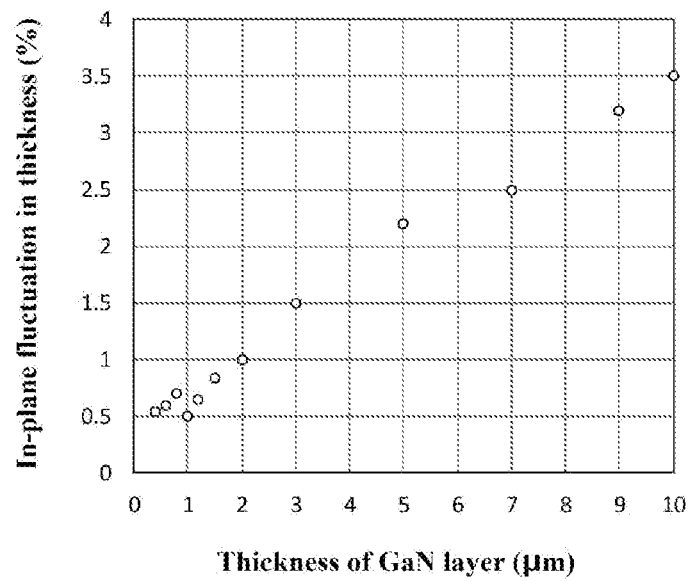
FIG. 7 is a graph showing the in-plane fluctuation in the thicknesses of the GaN layers according to the working example.

FIG. 7 is a graph showing the in-plane fluctuation in the thicknesses of the GaN layers according to the working example. In FIG. 7, the horizontal axis represents the thickness of the GaN layer, and the vertical axis represents the in-plane fluctuation in the thickness. The in-plane fluctuation in the thickness was likely to decrease as the thickness of the GaN layer was reduced. Reducing the thickness of the GaN layer to 7 µm or less made it possible to preferably reduce the in-plane fluctuation in the thickness to 3.5% or less, and more preferably 3% or less.

It should be noted that, among the measurement values in the case where the thickness of the GaN layer according to the working example was in a range of 7 µm or less, the minimum value of the in-plane fluctuation in the thickness of the GaN layer was 0.5% obtained from the measurement of the GaN layer having a thickness of 1 µm. The standard level of the minimum value of the in-plane fluctuation in the thickness of the GaN layer is 0.5% or 0.4%, for example.

In-Plane Uniformity of Dopant Concentration in GaN Layer

Figure 8:
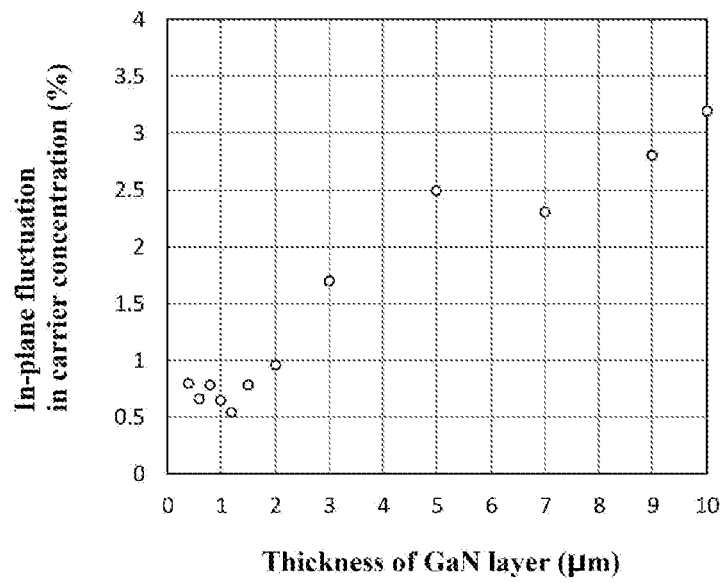
FIG. 8 is a graph showing the in-plane fluctuation in the dopant concentrations (carrier concentrations) in the GaN layers according to the working example.

FIG. 8 is a graph showing the in-plane fluctuation in the dopant concentrations (carrier concentrations) in the GaN layers according to the working example. In this working example, an n-type dopant was used as a dopant with which the GaN layer was doped, and the in-plane fluctuation in the n-type carrier concentration in the GaN layer was measured. The in-plane fluctuation in the n-type carrier concentration in the GaN layer can also be taken as the in-plane fluctuation in the n-type dopant concentration in the GaN layer. In FIG. 8, the horizontal axis represents the thickness of the GaN layer, and the vertical axis represents the fluctuation in the n-type carrier concentration, namely the in-plane fluctuation in the n-type dopant concentration. The in-plane fluctuation in the dopant concentration (carrier concentration) was likely to decrease as the thickness of the GaN layer was reduced. Reducing the thickness of the GaN layer to 7 µm or less made it possible to preferably reduce the in-plane fluctuation in the dopant concentration (carrier concentration) to 3.5% or less, and more preferably 3% or less.

It should be noted that, among the measurement values in the case where the thickness of the GaN layer according to the working example was in a range of 7 µm or less, the minimum value of the in-plane fluctuation in the dopant concentration (carrier concentration) was 0.54% obtained from the measurement of the GaN layer having a thickness of 1.2 µm. The standard level of the minimum value of the in-plane fluctuation in the dopant concentration (carrier concentration) in the GaN layer is 0.5% or 0.4%, for example.

Warping of Intermediate Wafer

FIG. 9 is a graph showing warping of intermediate wafers according to the working example. In FIG. 9, the horizontal axis represents the thickness of the GaN layer, and the vertical axis represents warping of the intermediate wafer. The warping of the intermediate wafer was likely to decrease as the thickness of the GaN layer was reduced. The warping of the intermediate wafer was 98 µm when the GaN layer had a thickness of 7 µm, and reducing the thickness of the GaN layer to 7 µm or less made it possible to preferably reduce the warping of the intermediate wafer to 110 µm or less, and more preferably 105 µm or less.

The element wafer is obtained by forming the light-emitting layer and the p-type layer on the intermediate wafer, and thus is thicker than the intermediate wafer. It should be noted that, when the thickness of the group III-nitride layer, which is constituted by the light-emitting layer and the p-type layer, is sufficiently reduced, an increase in warping caused by the light-emitting layer and the p-type layer can be suppressed. Reducing the thickness of the GaN layer to 7 µm or less also made it possible to preferably reduce the warping of the element wafer to 110 µm or less, and more preferably 105 µm or less.

It should be noted that, among the measurement values in the case where the thickness of the GaN layer according to the working example was in a range of 7 µm or less (and 0.8 µm or more), the minimum value of the warping of the intermediate wafer was 12 µm obtained from the measurement of the GaN layer having a thickness of 0.8 µm. The standard level of the minimum value of the warping of the intermediate wafer (or element wafer) is 10 µm, for example.

The GaN layer according to the working example and the intermediate wafer (or element wafer) including the GaN layer further have the following characteristics. The crystallizability of the GaN layer was likely to decrease as the thickness of the GaN layer was reduced, whereas the in-plane fluctuation in the thickness of the GaN layer, the in-plane fluctuation in the dopant concentration (carrier concentration) in the GaN layer, and the warping of the intermediate wafer (or element wafer) could be reduced as the thickness of the GaN layer was reduced (see FIG. 7 to FIG. 9).

For example, reducing the thickness of the GaN layer to 5 µm or less made it possible to preferably reduce the in-plane fluctuation in the thickness of the GaN layer to 3% or less, and more preferably 2.5% or less, preferably reduce the in-plane fluctuation in the dopant concentration (carrier concentration) in the GaN layer to 3% or less, and more preferably 2.5% or less, and preferably reduce the warping of the intermediate wafer (or element wafer) to 80 or less, and more preferably 75 µm or less. It should be noted that, among the measurement values in the case where the thickness of the GaN layer according to the working example was in a range of 5 µm or less, the minimum value of the half-value width of the (0002) face was 55 seconds obtained from the measurement of the GaN layer having a thickness of 3 µm, and the minimum value of the half-value width of the (10-12) face was 123 seconds obtained from the measurement of the GaN layer having a thickness of 5 µm. When the thickness is in this range, the standard level of the minimum value of the half-value width of the (0002) face is 50 seconds, for example. Moreover, the standard level of the minimum value of the half-value width of the (10-12) face is 115 seconds, for example.

Moreover, for example, reducing the thickness of the GaN layer to 3 µm or less made it possible to preferably reduce the in-plane fluctuation in the thickness of the GaN layer to 2.5% or less, and more preferably 2% or less, preferably reduce the in-plane fluctuation in the dopant concentration (carrier concentration) in the GaN layer to 2.5% or less, and more preferably 2% or less, and preferably reduce the warping of the intermediate wafer (or element wafer) to 50 µm or less, and more preferably 45 µm or less. It should be noted that, among the measurement values in the case where the thickness of the GaN layer according to the working example was in a range of 3 µm or less, the minimum value of the half-value width of the (0002) face was 55 seconds obtained from the measurement of the GaN layer having a thickness of 3 µm, and the minimum value of the half-value width of the (10-12) face was 143 seconds obtained from the measurement of the GaN layer having a thickness of 2 µm. When the thickness is in this range, the standard level of the minimum value of the half-value width of the (0002) face is 50 seconds, for example. Moreover, the standard level of the minimum value of the half-value width of the (10-12) face is 135 seconds, for example.

Moreover, for example, reducing the thickness of the GaN layer to 2 µm or less made it possible to preferably reduce the in-plane fluctuation in the thickness of the GaN layer to 2% or less, and more preferably 1.5% or less, preferably reduce the in-plane fluctuation in the dopant concentration (carrier concentration) in the GaN layer to 2% or less, and more preferably 1.5% or less, and preferably reduce the warping of the intermediate wafer (or element wafer) to 40 µm or less, and more preferably 35 µm or less. It should be noted that, among the measurement values in the case where the thickness of the GaN layer according to the working example was in a range of 2 µm or less, the minimum value of the half-value width of the (0002) face was 62 seconds obtained from the measurement of the GaN layer having a thickness of 2 µm, and the minimum value of the half-value width of the (10-12) face was 143 seconds obtained from the measurement of the GaN layer having a thickness of 2 µm. When the thickness is in this range, the standard level of the minimum value of the half-value width of the (0002) face is 55 seconds, for example. Moreover, the standard level of the minimum value of the half-value width of the (10-12) face is 135 seconds, for example.

Moreover, for example, reducing the thickness of the GaN layer to 1.5 µm or less made it possible to preferably reduce the in-plane fluctuation in the thickness of the GaN layer to 1.5% or less, and more preferably 1% or less, preferably reduce the in-plane fluctuation in the dopant concentration (carrier concentration) in the GaN layer to 1.5% or less, and more preferably 1% or less, and preferably reduce the warping of the intermediate wafer (or element wafer) to 35 µm or less, and more preferably 30 µm or less. It should be noted that, among the measurement values in the case where the thickness of the GaN layer according to the working example was in a range of 1.5 µm or less, the minimum value of the half-value width of the (0002) face was 68 seconds obtained from the measurement of the GaN layer having a thickness of 1.5 µm, and the minimum value of the half-value width of the (10-12) face was 160 seconds obtained from the measurement of the GaN layer having a thickness of 1.5 µm. When the thickness is in this range, the standard level of the minimum value of the half-value width of the (0002) face is 60 seconds, for example. Moreover, the standard level of the minimum value of the half-value width of the (10-12) face is 155 seconds, for example.

Moreover, for example, reducing the thickness of the GaN layer to 1.2 µm or less made it possible to preferably reduce the in-plane fluctuation in the thickness of the GaN layer to 1% or less, and more preferably 0.8% or less, preferably reduce the in-plane fluctuation in the dopant concentration (carrier concentration) in the GaN layer to 1% or less, and more preferably 0.8% or less, and preferably reduce the warping of the intermediate wafer (or element wafer) to 30 µm or less, and more preferably 25 µm or less. It should be noted that, among the measurement values in the case where the thickness of the GaN layer according to the working example was in a range of 1.2 µm or less, the minimum value of the half-value width of the (0002) face was 70 seconds obtained from the measurement of the GaN layer having a thickness of 1.2 µm, and the minimum value of the half-value width of the (10-12) face was 166 seconds obtained from the measurement of the GaN layer having a thickness of 1.2 µm. When the thickness is in this range, the standard level of the minimum value of the half-value width of the (0002) face is 65 seconds, for example. Moreover, the standard level of the minimum value of the half-value width of the (10-12) face is 160 seconds, for example.

It should be noted that there is a possibility that the above-described examples of the standard level of the minimum value of the half-value width of the (0002) face, the standard level of the minimum value of the half-value width of the (10-12) face, the standard level of the minimum value of the rms, the standard level of the minimum value of the in-plane fluctuation in the thickness of the GaN layer, the standard level of the minimum value of the in-plane fluctuation in the dopant concentration (carrier concentration) in the GaN layer, and the standard level of the minimum value of the warping of the intermediate wafer (or element wafer) can be further reduced.

In-Plane Uniformity of Light Emission Output

Figure 10:
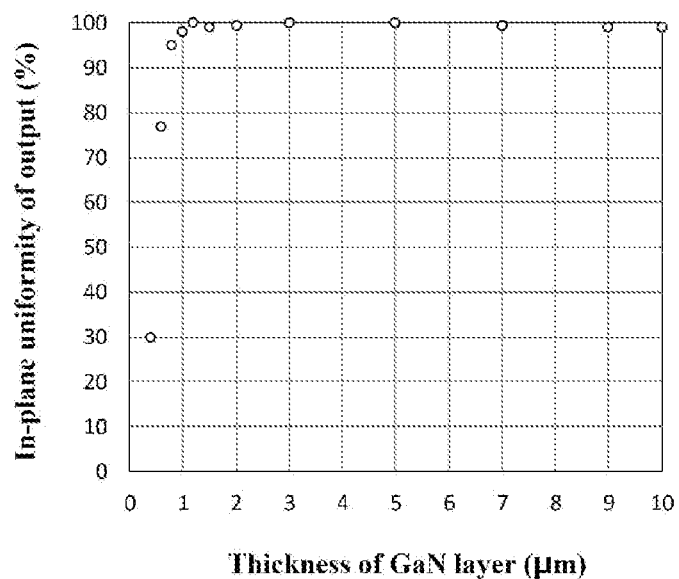
FIG. 10 is a graph showing the in-plane uniformity of the light emission output of semiconductor light-emitting elements according to the working example.
Figure 17:
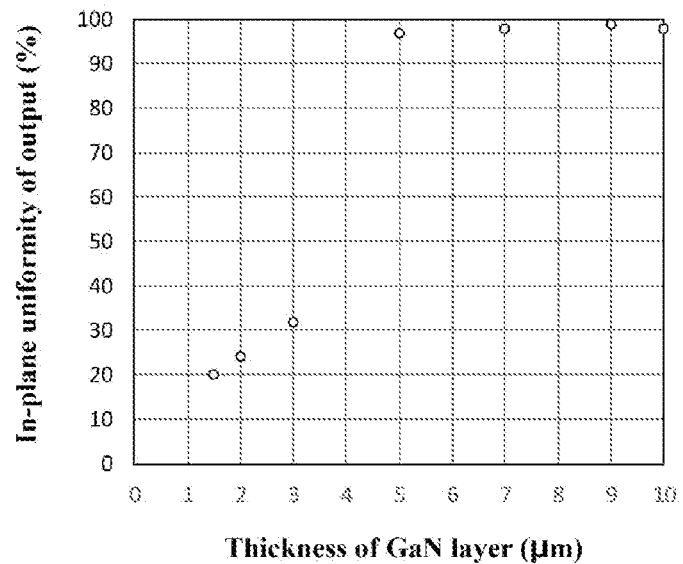
FIG. 17 is a graph showing the in-plane uniformity of the light emission output of semiconductor light-emitting elements according to the comparative example.

FIG. 10 is a graph showing the in-plane uniformity of the light emission output of the elements according to the working example, and FIG. 17 is a graph showing the in-plane uniformity of the light emission output of the elements according to the comparative example. The elements were examined regarding whether or not the reference light emission output (10 mW in this example) could be obtained (that is, whether or not the light emission output of 10 mW or more could be obtained) when a reference driving current (20 mA in this example) was applied. Then, the in-plane uniformity of the light emission output was evaluated based on a ratio of the number of elements that satisfied such a condition (condition for the light emission output) to the total number of elements obtained from the element wafer.

In both cases of the elements of the working example and the comparative example, the in-plane uniformity of the light emission output was as high as 90% or more when the GaN layer had a thickness larger than or equal to a certain level of thickness. However, in order to obtain such high in-plane uniformity, the GaN layer of the comparative example needed to have a thickness of 5 µm or more, whereas it was sufficient that the GaN layer of the working example had a thickness of 0.8 µm or more. In the case of the working example, the in-plane uniformity of the light emission output was 95% when the GaN layer had a thickness of 0.8 µm, and increasing the thickness of the GaN layer to 0.8 µm or more made it possible to preferably increase the in-plane uniformity of the light emission output to 90% or more, and more preferably 95% or more. It should be noted that the in-plane uniformity of the light emission output of the working example reached 100% in the cases where the GaN layer had a thickness of 1.2 µm, 3 µm, and 5 µm.

In-Plane Uniformity of Light Emission Wavelength

Figure 11:
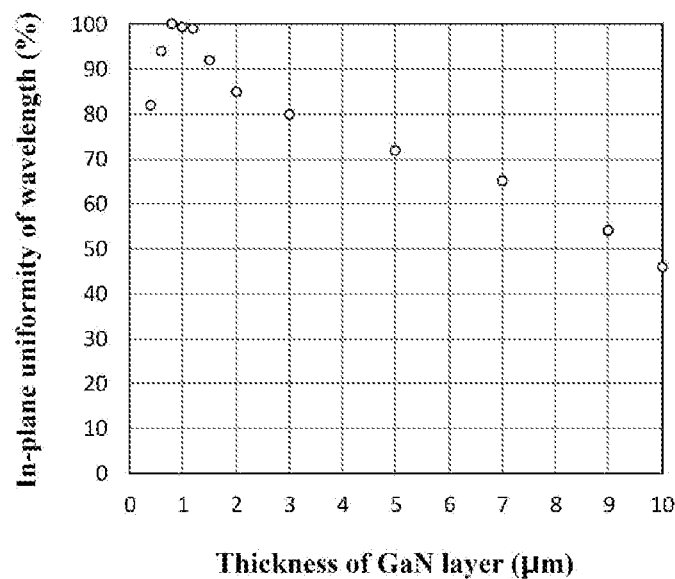
FIG. 11 is a graph showing the in-plane uniformity of the light emission wavelengths of the semiconductor light-emitting elements according to the working example.

FIG. 11 is a graph showing the in-plane uniformity of the light emission wavelengths of the elements according to the working example. The elements were examined regarding whether or not the light emission peak wavelength was within a range (440 nm or longer and 450 nm or shorter in this example) of a wavelength shorter by 5 nm than the reference light emission wavelength (445 nm in this example) to a wavelength longer by 5 nm than the reference light emission wavelength. Then, the in-plane uniformity of the light emission wavelength was evaluated based on a ratio of the number of elements that satisfied such a condition (condition for the light emission wavelength) to the total number of elements obtained from the element wafer.

In the case of the working example, in general, the in-plane uniformity of the light emission wavelength was likely to increase as the thickness of the GaN layer was reduced. The in-plane uniformity of the light emission wavelength reached 100% when the GaN layer had a thickness of 0.8 µm, but it was likely to decrease when the GaN layer had a thickness of less than 0.8 µm. The in-plane uniformity of the light emission wavelength was 65% when the GaN layer had a thickness of 7 and setting the thickness of the GaN layer to 7 µm or less (and 0.8 µm or more) made it possible to increase the in-plane uniformity of the light emission wavelength to 60% or more. The in-plane uniformity of the light emission wavelength was 72% when the GaN layer had a thickness of 5 µm, and setting the thickness of the GaN layer to 5 µm or less (and 0.8 µm or more) made it possible to increase the in-plane uniformity of the light emission wavelength to 70% or more. The in-plane uniformity of the light emission wavelength was 80% when the GaN layer had a thickness of 3 µm, and setting the thickness of the GaN layer to 3 µm or less (and 0.8 µm or more) made it possible to increase the in-plane uniformity of the light emission wavelength to 80% or more.

Figure 18:
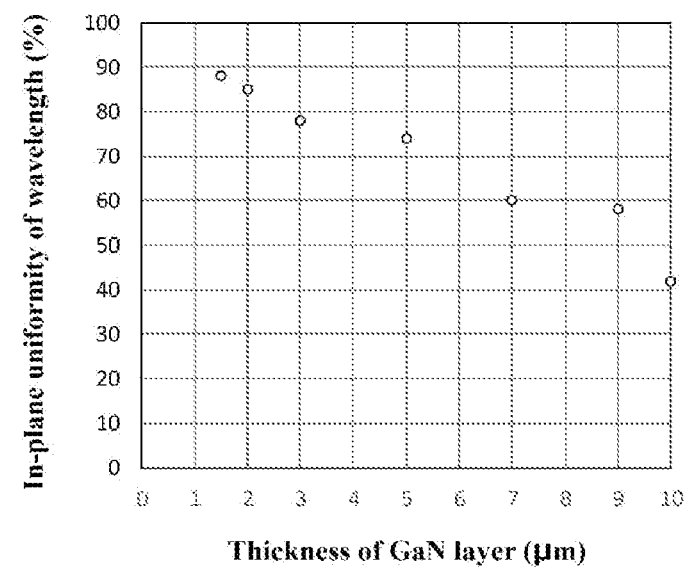
FIG. 18 is a graph showing the in-plane uniformity of the light emission wavelengths of the semiconductor light-emitting elements according to the comparative example.

FIG. 18 is a graph showing the in-plane uniformity of the light emission wavelengths of the elements according to the comparative example. Also in the case of the comparative example, in general, in-plane uniformity of the light emission wavelength was likely to increase as the thickness of the GaN layer was reduced, but the maximum value of the in-plane uniformity of the light emission wavelength did not reach 90%. It should be noted that, in the case of the comparative example, elements including a GaN layer having a thickness of less than 1.5 µm could not be produced.

In-Plane Uniformity of Driving Voltage

Figure 12:
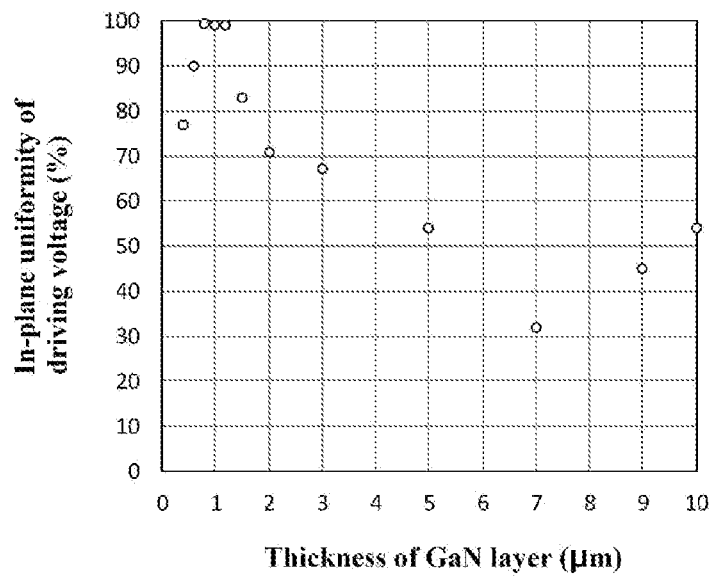
FIG. 12 is a graph showing the in-plane uniformity of the driving voltages of the semiconductor light-emitting elements according to the working example.

FIG. 12 is a graph showing the in-plane uniformity of the driving voltages of the elements according to the working example. The elements were examined regarding whether or not the driving voltage for generating the reference driving current (20 mA in this example) was within a range (3.2 V or more and 3.4 V or less in this example) of a voltage lower by 0.1 V than the reference driving voltage (3.3 V in this example) to a voltage higher by 0.1 V than the reference driving voltage. Then, the in-plane uniformity of the driving voltage was evaluated based on a ratio of the number of elements that satisfied such a condition (condition for the driving voltage) to the total number of elements obtained from the element wafer.

In the case of the working example, in general, the in-plane uniformity of the driving voltage was likely to increase as the thickness of the GaN layer was reduced. The in-plane uniformity of the driving voltage reached 99.4%, which is substantially 100%, when the GaN layer had a thickness of 0.8 µm, but it was likely to decrease when the GaN layer had a thickness of less than 0.8 µm. The in-plane uniformity of the driving voltage was 67% when the GaN layer had a thickness of 3 µm, and setting the thickness of the GaN layer to 3 µm or less (and 0.8 µm or more) made it possible to increase the in-plane uniformity of the driving voltage to 60% or more. The in-plane uniformity of the driving voltage was 71% when the GaN layer had a thickness of 2 and setting the thickness of the GaN layer to 2 µm or less (and 0.8 µm or more) made it possible to increase the in-plane uniformity of the driving voltage to 70% or more. The in-plane uniformity of the driving voltage was 83% when the GaN layer had a thickness of 1.5 and setting the thickness of the GaN layer to 1.5 µm or less (and 0.8 or more) made it possible to increase the in-plane uniformity of the driving voltage to 80% or more.

Figure 19:
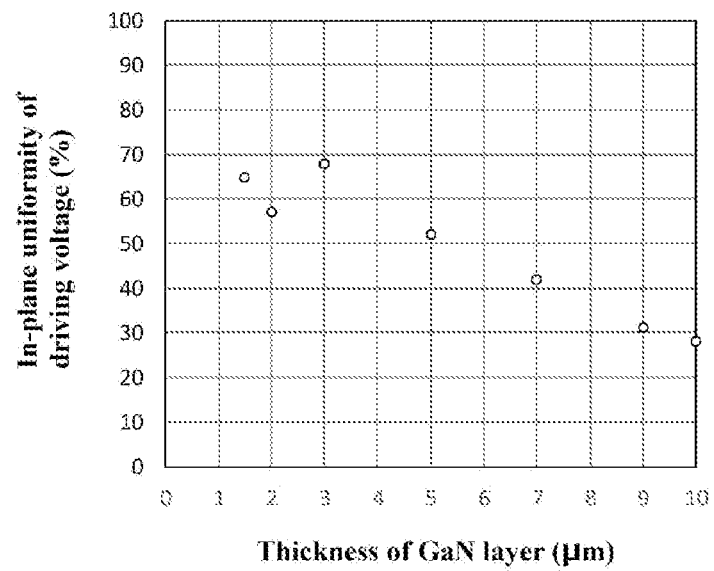
FIG. 19 is a graph showing the in-plane uniformity of the driving voltages of the semiconductor light-emitting elements according to the comparative example.

FIG. 19 is a graph showing the in-plane uniformity of the driving voltages of the elements according to the comparative example. Also in the case of the comparative example, in general, in-plane uniformity of the driving voltage was likely to increase as the thickness of the GaN layer was reduced, but the maximum value of the in-plane uniformity of the light emission wavelength did not reach 70%. It should be noted that, in the case of the comparative example, elements including a GaN layer having a thickness of less than 1.5 µm could not be produced.

In-Plane Uniformity of Reverse-Direction Leakage Current Suppressing Effect

Figure 13:
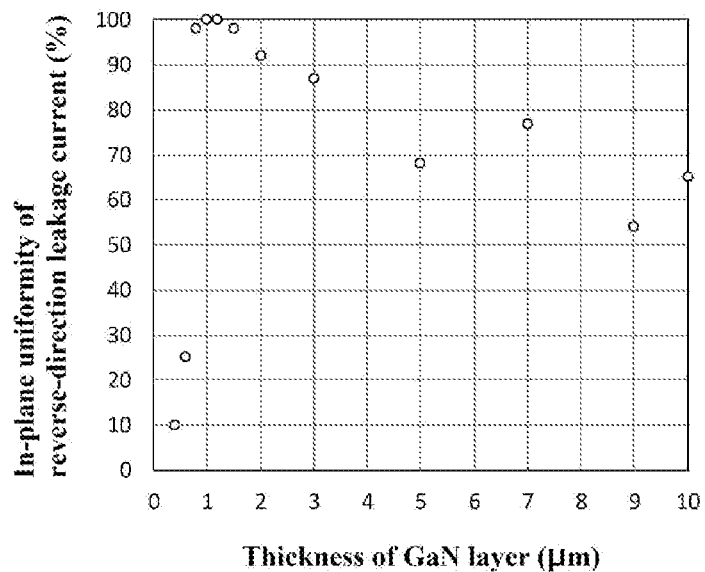
FIG. 13 is a graph showing the in-plane uniformity of the reverse-direction leakage current suppressing effects of the semiconductor light-emitting elements according to the working example.

FIG. 13 is a graph showing the in-plane uniformity of the reverse-direction leakage current suppressing effects of the elements according to the working example. The elements were examined regarding whether or not a leakage current was 1 µA or less when a reverse-direction voltage of 20 V was applied between the GaN layer, which was an n-type layer, and the p-type layer. Then, the in-plane uniformity of the reverse-direction leakage current suppressing effect (also referred to as a "leakage suppressing effect" hereinafter) was evaluated based on a ratio of the number of elements that satisfied such a condition (condition for the reverse-direction leakage current) to the total number of elements obtained from the element wafer.

In the case of the working example, in general, the in-plane uniformity of the leakage suppressing effect was likely to increase as the thickness of the GaN layer was reduced. The in-plane uniformity of the leakage suppressing effect reached 100% in the cases where the GaN layer had a thickness of 1.2 µm and 1 µm, and it was as high as 98% when the GaN layer had a thickness of 0.8 µm, but it was likely to significantly decrease when the GaN layer had a thickness of less than 0.8 µm. The in-plane uniformity of the leakage suppressing effect was 68% when the GaN layer had a thickness of 5 µm, and setting the thickness of the GaN layer to 5 µm or less (and 0.8 µm or more) made it possible to increase the in-plane uniformity of the leakage suppressing effect to 60% or more. The in-plane uniformity of the light emission wavelength was 87% when the GaN layer had a thickness of 3 µm, and setting the thickness of the GaN layer to 3 µm or less (and 0.8 µm or more) made it possible to preferably increase the in-plane uniformity of the light emission wavelength to 70% or more, and more preferably 80% or more.

Figure 20:
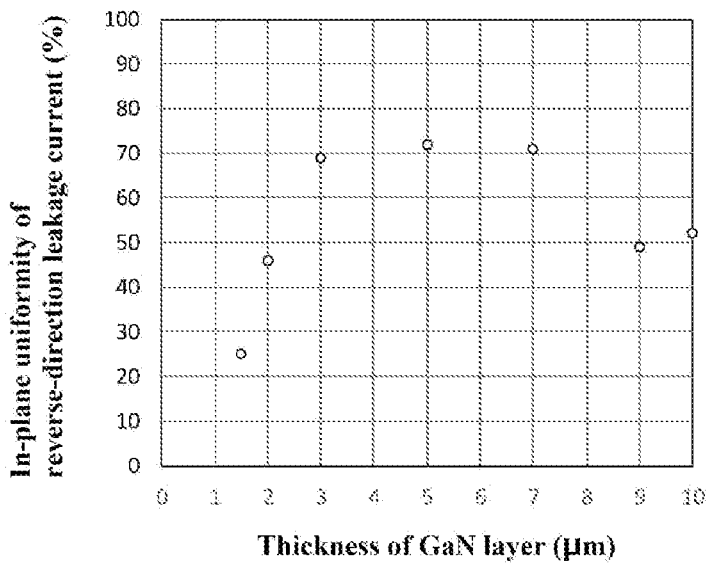
FIG. 20 is a graph showing the in-plane uniformity of the reverse-direction leakage current suppressing effects of the semiconductor light-emitting elements according to the comparative example.

FIG. 20 is a graph showing the in-plane uniformity of the leakage suppressing effects of the elements according to the comparative example. In the case of the comparative example, the leakage suppressing effect was likely to be higher in the case where the GaN layer had a thickness of 7 µm, 5 or 3 µm compared with the case where the GaN layer had a thickness of 9 µm or 10 µm, but was likely to decrease when the GaN layer had a thickness of less than 3 and was about 70% even at the maximum. It should be noted that, in the case of the comparative example, elements including a GaN layer having a thickness of less than 1.5 could not be produced.

Total Yield

Figure 14:
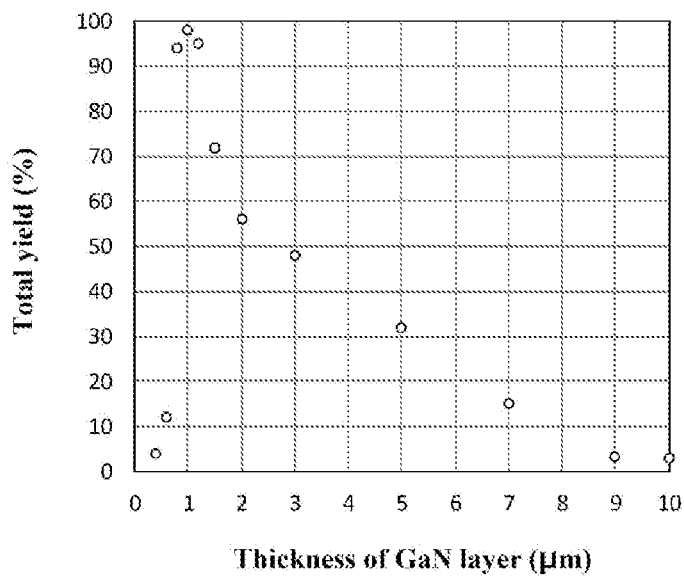
FIG. 14 is a graph showing the total yields of the semiconductor light-emitting elements according to the working example.

FIG. 14 is a graph showing the total yields of the elements according to the working example. The elements were examined regarding whether or not all of the condition for the light emission output, the condition for the light emission wavelength, the condition for the driving voltage, and the condition for the reverse-direction leakage current as described above were satisfied. Then, the total yield was evaluated based on a ratio of the number of elements that satisfied all of these conditions (conditions for the total yield) to the total number of elements obtained from the element wafer.

In the case of the working example, in general, the total yield was likely to increase as the thickness of the GaN layer was reduced. The total yield reached 98%, which is close to 100%, when the GaN layer had a thickness of 1 μm, and it was as high as 94% when the GaN layer had a thickness of 0.8 μm, but it was likely to significantly decrease when the GaN layer had a thickness of less than 0.8 μm.

Figure 21:
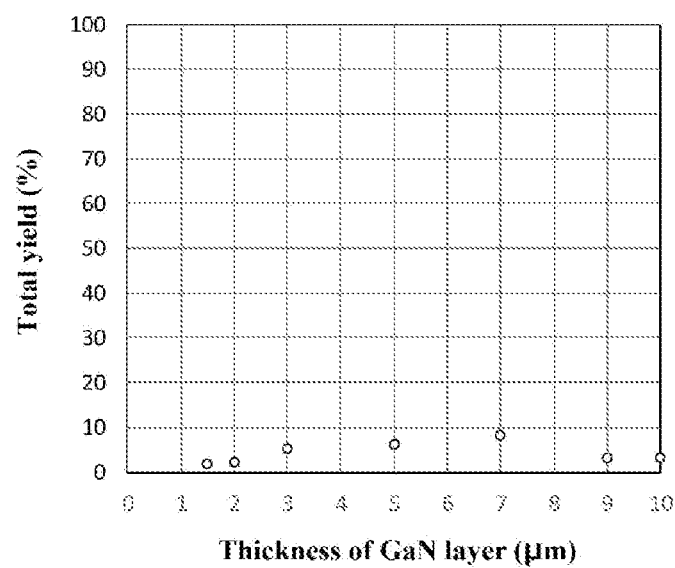
FIG. 21 is a graph showing the total yields of the semiconductor light-emitting elements according to the comparative example.

FIG. 21 is a graph showing the total yields of the elements according to the comparative example. In the case of the comparative example, the total yield was no more than several % irrespective of the thickness of the GaN layer, and even the maximum total yield was 8.2% (the GaN layer had a thickness of 7 μm), which is less than 10%. It should be noted that, in the case of the comparative example, elements including a GaN layer having a thickness of less than 1.5 μm could not be produced.

On the contrary, in the case of the working example, the total yield was 15% when the GaN layer had a thickness of 7 and setting the thickness of the GaN layer to 7 μm or less (and 0.8 μm or more) made it possible to increase the total yield to 10% or more, which is higher than that in the comparative example. The total yield was 32% when the GaN layer had a thickness of 5 μm, and setting the thickness of the GaN layer to 5 μm or less (and 0.8 μm or more) made it possible to increase the total yield to 30% or more. Moreover, the total yield could be increased to 48%, which is close to 50%, when the GaN layer had a thickness of 3 and setting the thickness of the GaN layer to 3 μm or less (and 0.8 μm or more) made it possible to increase the total yield to 40% or more.

Furthermore, the total yield was 56%, which is greater than 50%, when the GaN layer had a thickness of 2 μm, and setting the thickness of the GaN layer to 2 μm or less (and 0.8 μm or more) made it possible to increase the total yield to 50% or more. The total yield was 72% when the GaN layer had a thickness of 1.5 μm, and setting the thickness of the GaN layer to 1.5 or less (and 0.8 μm or more) made it possible to increase the total yield to 70% or more. The total yield was 95% when the GaN layer had a thickness of 1.2 and setting the thickness of the GaN layer to 1.2 μm or less (and 0.8 μm or more) made it possible to increase the total yield to 90% or more. It should be noted that the total yield was likely to be significantly improved when the GaN layer had a thickness of 2 μm or less, and therefore, it can be said that the thickness of the GaN layer is particularly preferably 2 μm or less (and 0.8 μm or more) from the viewpoint of improving the total yield.

Other Embodiments

The present invention is not limited to the embodiment described above, and it goes without saying that various modifications may be made without departing from the gist of the present invention. Moreover, various embodiments may be combined as appropriate.

In the embodiment described above, the aspect in which the wafer 150 is formed by manufacturing the wafer 90 serving as an AlN template and then forming the GaN layer 30 and the group III-nitride layer 40 on the wafer 90 is shown as an example. Aspects for manufacturing the wafer 150 are not limited to the above-mentioned aspect. For example, the wafer 150 may also be manufactured by manufacturing a GaN template obtained by forming the AlN layer 20 and the GaN layer 30 on the sapphire substrate 10, and then forming the group III-nitride layer 40 on the GaN template. Moreover, for example, the wafer 150 may also be manufactured by forming the AlN layer 20, the GaN layer 30, and the group III-nitride layer 40 on the sapphire substrate 10 through a series of crystal growth.

The GaN layer 30 that is included in the wafer 150 according to the embodiment described above is of high quality. Since the GaN layer 30 is of high quality, the quality of the light-emitting element 200 manufactured using the wafer 150 can be improved even if various types of light-emitting layers 41 and p-type layers 42 are used to form the group III-nitride layer 40. More specifically, when many light-emitting elements 200 having a size of 10-μm square or more and 3000-μm square (3-mm square) or less (or having an area of 100 $\mu m^2$ or more and 9000000 $\mu m^2$ (9 $mm^2$) or less) are formed on the wafer 150 manufactured using the sapphire substrate 10 having a diameter of 2 inches or more, for example, the performance of the light-emitting elements 200 can be improved, and the fluctuation in performance between the light-emitting elements 200 can be suppressed.

The following are standards of favorable characteristics of one light-emitting element 200. The light emission output is preferably 10 mW or more, for example. In order to preferably increase a ratio of the number of light-emitting elements 200 that satisfy such a condition (condition for the light emission output) to the total number of elements obtained from the wafer 150 (in-plane uniformity of the light emission output) to 90% or more, and more preferably 95% or more, the thickness of the GaN layer 30 is preferably 0.8 μm or more in the wafer 150 according to the embodiment described above.

It is preferable that the light emission peak wavelength is within a range of a wavelength shorter by 5 nm than the reference light emission wavelength (designed value of the light emission wavelength) to a wavelength longer by 5 nm than the reference light emission wavelength. In order to preferably increase the ratio of the number of light-emitting elements 200 that satisfy such a condition (condition for the light emission wavelength) to the total number of elements obtained from the wafer 150 (in-plane uniformity of the light emission wavelength) to 60% or more, more preferably 70% or more, and even more preferably 80% or more, the thickness of the GaN layer 30 is preferably 7 μm or less, more preferably 5 μm or less, and even more preferably 3 μm or less, (and 0.8 μm or more) in the wafer 150 according to the embodiment described above.

The reference light emission wavelength may be selected as appropriate depending on the configuration of the light-emitting layer 41. The reference light emission wavelength may be selected from the near-ultraviolet region of 380 nm to 400 nm, the blue region of 440 nm to 460 nm, or the green region of 520 nm to 530 nm, for example. The reference light emission wavelength may be selected from the collective region of 380 nm to 530 nm.

Although the driving voltage for generating the reference driving current (designed value of the driving current) may be changed depending on the element size, the wavelength, and the configurations of the layers, it is preferable that the driving voltage is within a range of a voltage lower by 0.1 V than the reference driving voltage (designed value of the driving voltage) stipulated by the design to a voltage higher by 0.1 V than the reference driving voltage. In order to preferably increase a ratio of the number of light-emitting elements 200 that satisfy such a condition (condition for the driving voltage) to the total number of elements obtained from the wafer 150 (in-plane uniformity of the driving voltage) to 60% or more, more preferably 70% or more, and even more preferably 80% or more, for example, the thickness of the GaN layer 30 is preferably 3 µm or less, more preferably 2 µm or less, and even more preferably 1.5 µm or less, (and 0.8 µm or more) in the wafer 150 according to the embodiment described above.

The reference driving current and the reference driving voltage may be selected as appropriate depending on the configuration of the light-emitting element 200. The reference driving current is preferably selected from a range of 15 mA to 25 mA and is typically 20 mA, and the reference driving voltage is preferably selected from a range of 3 V to 3.5 V and is typically 3.3 V.

Regarding the characteristic relating to reverse-direction withdraw voltage, a leakage current is preferably 1 µA or less when a reverse-direction voltage of 20 V is applied between the GaN layer, which is an n-type layer, and the p-type layer, for example. In order to preferably increase a ratio of the number of light-emitting elements 200 that satisfy such a condition (condition for the reverse-direction leakage current) to the total number of elements obtained from the wafer 150 (in-plane uniformity of the reverse-direction leakage current suppressing effect) to 60% or more, more preferably 70% or more, and even more preferably 80% or more, the thickness of the GaN layer 30 is preferably 5 µm or less, and more preferably 3 µm or less, (and 0.8 µm or more) in the wafer 150 according to the embodiment described above.

In order to preferably increase a ratio of the number of light-emitting elements 200 that satisfy all of the condition for the light emission output, the condition for the light emission wavelength, the condition for the driving voltage, and the condition for the reverse-direction leakage current to the total number of elements obtained from the wafer 150 to 10% or more, more preferably 30% or more, even more preferably 40% or more, even more preferably 50% or more, even more preferably 70% or more, and even more preferably 90% or more, the thickness of the GaN layer 30 is preferably 7 µm or less, more preferably 5 µm or less, even more preferably 3 µm or less, even more preferably 2 µm or less, even more preferably 1.5 µm or less, and even more preferably 1.2 µm or less, (and 0.8 µm or more) in the wafer 150 according to the embodiment described above.

Favorable Aspects of the Present Invention

The following are supplementary notes of favorable aspects of the present invention.

Supplementary Note 1

A group III-nitride laminated substrate including:

a sapphire substrate (having a diameter of 2 inches or more);

a first layer that is formed on the sapphire substrate and is made of aluminum nitride;

a second layer that is formed on the first layer and serves as an n-type layer made of gallium nitride and doped with an n-type dopant;

a third layer that is formed on the second layer and serves as a light-emitting layer made of a group III-nitride; and a fourth layer that is formed on the third layer and serves as a p-type layer made of a group III-nitride and doped with a p-type dopant, wherein the second layer has a thickness of 7 µm or less, a half-value width of (0002) diffraction determined through X-ray rocking curve analysis is 100 seconds or less, and a half-value width of (10-12) diffraction determined through X-ray rocking curve analysis is 200 seconds or less.

The sapphire substrate preferably has a diameter of 2 inches and a thickness of 300 µm or more and 500 µm or less, a diameter of 4 inches and a thickness of 600 µm or more and 1000 µm or less, or a diameter of 6 inches and a thickness of 1000 µm or more and 1500 µm or less, for example.

Supplementary Note 2

The group III-nitride laminated substrate according to Supplementary Note 1, wherein the second layer has a thickness of 0.8 µm or more.

Supplementary Note 3

The group III-nitride laminated substrate according to Supplementary Note 1 or 2, wherein the first layer has a thickness of 1 µm or less.

Supplementary Note 4

The group III-nitride laminated substrate according to any one of Supplementary Notes 1 to 3, wherein a layer constituted by the third layer and the fourth layer has a thickness of 1 µm or less.

Supplementary Note 5

The group III-nitride laminated substrate according to any one of Supplementary Notes 1 to 4, wherein in-plane fluctuation in the thickness of the second layer is 3.5% or less (more preferably 3% or less).

Supplementary Note 6

The group III-nitride laminated substrate according to any one of Supplementary Notes 1 to 5, wherein in-plane fluctuation in an n-type carrier concentration (n-type dopant concentration) in the second layer is 3.5% or less (more preferably 3% or less).

Supplementary Note 7

The group III-nitride laminated substrate according to any one of Supplementary Notes 1 to 6, wherein warping of the group III-nitride laminated substrate is 110 µm or less (more preferably 105 µm or less).

Supplementary Note 8

The group III-nitride laminated substrate according to any one of Supplementary Notes 1 to 7, wherein the second layer has a thickness of 5 µm or less.

Supplementary Note 9

The group III-nitride laminated substrate according to Supplementary Note 8, wherein in-plane fluctuation in the thickness of the second layer is 3% or less (more preferably 2.5% or less).

Supplementary Note 10

The group III-nitride laminated substrate according to Supplementary Note 8 or 9, wherein in-plane fluctuation in an n-type carrier concentration (n-type dopant concentration) in the second layer is 3% or less (more preferably 2.5% or less).

Supplementary Note 11

The group III-nitride laminated substrate according to any one of Supplementary Notes 8 to 10, wherein warping of the group III-nitride laminated substrate is 80 µm or less (more preferably 75 µm or less).

Supplementary Note 12

The group III-nitride laminated substrate according to any one of Supplementary Notes 1 to 11, wherein the second layer has a thickness of 3 µm or less.

Supplementary Note 13

The group III-nitride laminated substrate according to Supplementary Note 12, wherein in-plane fluctuation in the thickness of the second layer is 2.5% or less (more preferably 2% or less).

Supplementary Note 14

The group III-nitride laminated substrate according to Supplementary Note 12 or 13, wherein in-plane fluctuation in an n-type carrier concentration (n-type dopant concentration) in the second layer is 2.5% or less (more preferably 2% or less).

Supplementary Note 15

The group III-nitride laminated substrate according to any one of Supplementary Notes 12 to 14, wherein warping of the group III-nitride laminated substrate is 50 μm or less (more preferably 45 μm or less).

Supplementary Note 16

The group III-nitride laminated substrate according to any one of Supplementary Notes 1 to 15, wherein the second layer has a thickness of 2 μm or less.

Supplementary Note 17

The group III-nitride laminated substrate according to Supplementary Note 16, wherein in-plane fluctuation in the thickness of the second layer is 2% or less (more preferably 1.5% or less).

Supplementary Note 18

The group III-nitride laminated substrate according to Supplementary Note 16 or 17, wherein in-plane fluctuation in an n-type carrier concentration (n-type dopant concentration) in the second layer is 2% or less (more preferably 1.5% or less).

Supplementary Note 19

The group III-nitride laminated substrate according to any one of Supplementary Notes 16 to 18, wherein warping of the group III-nitride laminated substrate is 40 μm or less (more preferably 35 μm or less).

Supplementary Note 20

The group III-nitride laminated substrate according to any one of Supplementary Notes 1 to 19, wherein the second layer has a thickness of 1.5 μm or less.

Supplementary Note 21

The group III-nitride laminated substrate according to Supplementary Note 20, wherein in-plane fluctuation in the thickness of the second layer is 1.5% or less (more preferably 1% or less).

Supplementary Note 22

The group III-nitride laminated substrate according to Supplementary Note 20 or 21, wherein in-plane fluctuation in an n-type carrier concentration (n-type dopant concentration) in the second layer is 1.5% or less (more preferably 1% or less).

Supplementary Note 23

The group III-nitride laminated substrate according to any one of Supplementary Notes 20 to 22, wherein warping of the group III-nitride laminated substrate is 35 μm or less (more preferably 30 μm or less).

Supplementary Note 24

The group III-nitride laminated substrate according to any one of Supplementary Notes 1 to 23, wherein the second layer has a thickness of 1.2 μm or less.

Supplementary Note 25

The group III-nitride laminated substrate according to Supplementary Note 24, wherein in-plane fluctuation in the thickness of the second layer is 1% or less (more preferably 0.8% or less).

Supplementary Note 26

The group III-nitride laminated substrate according to Supplementary Note 24 or 25, wherein in-plane fluctuation in an n-type carrier concentration (n-type dopant concentration) in the second layer is 1% or less (more preferably 0.8% or less).

Supplementary Note 27

The group III-nitride laminated substrate according to any one of Supplementary Notes 24 to 36, wherein warping of the group III-nitride laminated substrate is 30 μm or less (more preferably 25 μm or less).

Supplementary Note 28

The group III-nitride laminated substrate according to any one of Supplementary Notes 1 to 27, wherein the second layer has a thickness of 0.8 μm or more, and a ratio of the number of semiconductor light-emitting elements in which a light emission output of 10 mW or more can be obtained to the total number of semiconductor light-emitting elements obtained from the group III-nitride laminated substrate is 90% or more (more preferably 95% or more).

Supplementary Note 29

The group III-nitride laminated substrate according to any one of Supplementary Notes 1 to 28, wherein the second layer has a thickness of 7 μm or less (more preferably 5 μm or less and even more preferably 3 μm or less) (and 0.8 μm or more), and a ratio of the number of semiconductor light-emitting elements in which a light emission peak wavelength is within a range of a wavelength shorter by 5 nm than a reference light emission wavelength to a wavelength longer by 5 nm than the reference light emission wavelength to the total number of semiconductor light-emitting elements obtained from the group III-nitride laminated substrate is 60% or more (more preferably 70% or more and even more preferably 80% or more).

The reference light emission wavelength is preferably selected from a region of 380 nm to 530 nm, and is typically selected from the near-ultraviolet region of 380 nm to 400 nm, the blue region of 440 nm to 460 nm, or the green region of 520 nm to 530 nm, for example.

Supplementary Note 30

The group III-nitride laminated substrate according to any one of Supplementary Notes 1 to 29, wherein the second layer has a thickness of 3 μm or less (more preferably 2 μm or less and even more preferably 1.5 μm or less) (and 0.8 μm or more), and a ratio of the number of semiconductor light-emitting elements in which a driving voltage for generating a reference driving current is within a range of a voltage lower by 0.1 V than a reference driving voltage to a voltage higher by 0.1 V than the reference driving voltage to the total number of semiconductor light-emitting elements obtained from the group III-nitride laminated substrate is 60% or more (more preferably 70% or more and even more preferably 80% or more).

The reference driving current is preferably selected from a range of 15 mA to 25 mA, and is typically 20 mA. The reference driving voltage is preferably selected from a range of 3 V to 3.5 V, and is typically 3.3 V.

Supplementary Note 31

The group III-nitride laminated substrate according to any one of Supplementary Notes 1 to 30, wherein the second layer has a thickness of 5 μm or less (more preferably 3 μm or less) (and 0.8 μm or more), and a ratio of the number of semiconductor light-emitting elements in which a leakage current is 1 μA or less when a reverse-direction voltage of 20 V is applied between the second layer and the fourth layer to the total number of semiconductor light-emitting elements obtained from the group III-nitride laminated substrate is 60% or more (more preferably 70% or more and even more preferably 80% or more).

Supplementary Note 32

The group III-nitride laminated substrate according to any one of Supplementary Notes 1 to 31, wherein the second layer has a thickness of 7 µm or less (more preferably 5 µm or less, even more preferably 3 µm or less, even more preferably 2 µm or less, even more preferably 1.5 or less, and even more preferably 1.2 µm or less) (and 0.8 µm or more), and a ratio of the number of semiconductor light-emitting elements in which a light emission output of 10 mW or more is obtained, a light emission peak wavelength is within a range of a wavelength shorter by 5 nm than a reference light emission wavelength to a wavelength longer by 5 nm than the reference light emission wavelength, a driving voltage for generating a reference driving current is within a range of a voltage lower by 0.1 V than a reference driving voltage to a voltage higher by 0.1 V than the reference driving voltage, and a leakage current is 1 µA or less when a reverse-direction voltage of 20 V is applied between the second layer and the fourth layer, to the total number of semiconductor light-emitting elements obtained from the group III-nitride laminated substrate is 10% or more (more preferably 30% or more, even more preferably 40% or more, even more preferably 50% or more, even more preferably 70% or more, and even more preferably 90% or more).

Supplementary Note 33

The group III-nitride laminated substrate according to any one of Supplementary Notes 1 to 32, wherein each of the semiconductor light-emitting elements has a size of 10-µm square or more and 3000-µm square (3-mm square) or less (preferably 100-µm square or less) in a plan view, or has an area of 100 µm² or more and 9000000 µm² (9 mm²) or less (preferably 10000 µm² or less) in a plan view.

Supplementary Note 34

A semiconductor light-emitting element, including, as an n-type layer, the second layer included in the group III-nitride laminated substrate according to any one of Supplementary Notes 1 to 33.

Supplementary Note 35

A group III-nitride laminated substrate including:

a sapphire substrate (having a diameter of 2 inches or more); and a first layer that is formed on the sapphire substrate and is made of aluminum nitride, wherein a surface of the first layer is to be used as a base for growth of a second layer that is made of gallium nitride and has a thickness of 7 µm or less and in which a half-value width of (0002) diffraction determined through X-ray rocking curve analysis is 100 seconds or less, and a half-value width of (10-12) diffraction determined through X-ray rocking curve analysis is 200 seconds or less. It is preferable that a surface of the first layer is to be used as a base for growth of the second layer according to any one of Supplementary Notes 2 to 26.

LIST OF REFERENCE NUMERALS

10 . . . underlying substrate, 11 . . . principal surface (of underlying substrate), 20 . . . AlN layer, 21 . . . surface (of AlN layer), 30 . . . GaN layer, 31 . . . surface (of GaN layer), 40 . . . group III-nitride layer, 41 . . . light-emitting layer, 42 . . . p-type layer, 50 . . . electrode, 51 . . . n-side electrode, 52 . . . p-side electrode, 60 . . . operating layer, 90 . . . group III-nitride laminated substrate, 100 . . . group III-nitride laminated substrate, 150 . . . group III-nitride laminated substrate, 200 . . . semiconductor light-emitting element, 210 . . . circuit board, 220 . . . bump

What is claimed is:

1. A group III-nitride laminated substrate comprising: a sapphire substrate;
   a first layer that is formed on the sapphire substrate and is made of aluminum nitride; a second layer that is formed on the first layer and serves as an n-type layer made of gallium nitride and doped with an n-type dopant;
   a third layer that is formed on the second layer and serves as a light-emitting layer made of a group III-nitride; and
   a fourth layer that is formed on the third layer and serves as a p-type layer made of a group III-nitride and doped with a p-type dopant,
   wherein the second layer has a thickness of 7 µm or less, a half-value width of (0002) diffraction determined through X-ray rocking curve analysis is 100 seconds or less, and a half-value width of (10-12) diffraction determined through X-ray rocking curve analysis is 200 seconds or less.

2. The group III-nitride laminated substrate according to claim 1, wherein in-plane fluctuation in the thickness of the second layer is 3.5% or less.

3. The group III-nitride laminated substrate according to claim 1, wherein in-plane fluctuation in an n-type carrier concentration in the second layer is 3.5% or less.

4. The group III-nitride laminated substrate according to claim 1, wherein warping of the group III-nitride laminated substrate is 110 µm or less.

5. The group III-nitride laminated substrate according to claim 1, wherein the second layer has a thickness of 3 µm or less.

6. The group III-nitride laminated substrate according to claim 5, wherein in-plane fluctuation in the thickness of the second layer is 2.5% or less.

7. The group III-nitride laminated substrate according to claim 5, wherein in-plane fluctuation in an n-type carrier concentration in the second layer is 2.5% or less.

8. The group III-nitride laminated substrate according to claim 5, wherein warping of the group III-nitride laminated substrate is 50 µm or less.

9. The group III-nitride laminated substrate according to claim 1, wherein the second layer has a thickness of 0.8 µm or more, and
   a ratio of the number of semiconductor light-emitting elements in which a light emission output of 10 mW or more can be obtained to the total number of semiconductor light-emitting elements obtained from the group III-nitride laminated substrate is 90% or more.

10. The group III-nitride laminated substrate according to claim 1, wherein the second layer has a thickness of 7 µm or less, and
    a ratio of the number of semiconductor light-emitting elements in which a light emission peak wavelength is within a range of a wavelength shorter by 5 nm than a reference light emission wavelength to a wavelength longer by 5 nm than the reference light emission wavelength to the total number of semiconductor light-emitting elements obtained from the group III-nitride laminated substrate is 60% or more.

11. The group III-nitride laminated substrate according to claim 1, wherein the second layer has a thickness of 3 μm or less, and
   a ratio of the number of semiconductor light-emitting elements in which a driving voltage for generating a reference driving current is within a range of a voltage lower by 0.1 V than a reference driving voltage to a voltage higher by 0.1 V than the reference driving voltage to the total number of semiconductor light-emitting elements obtained from the group III-nitride laminated substrate is 60% or more.

12. The group III-nitride laminated substrate according to claim 1,
   wherein the second layer has a thickness of 5 μm or less, and
   a ratio of the number of semiconductor light-emitting elements in which a leakage current is 1 μA or less when a reverse-direction voltage of 20 V is applied between the second layer and the fourth layer to the total number of semiconductor light-emitting elements obtained from the group III-nitride laminated substrate is 60% or more.

13. The group III-nitride laminated substrate according to claim 1, wherein the second layer has a thickness of 7 μm or less, and
   a ratio of the number of semiconductor light-emitting elements in which a light emission output of 10 mW or more is obtained,
   a light emission peak wavelength is within a range of a wavelength shorter by 5 nm than a reference light emission wavelength to a wavelength longer by 5 nm than the reference light emission wavelength,
   a driving voltage for generating a reference driving current is within a range of a voltage lower by 0.1 V than a reference driving voltage to a voltage higher by 0.1 V than the reference driving voltage, and
   a leakage current is 1 μA or less when a reverse-direction voltage of 20 V is applied between the second layer and the fourth layer,
   to the total number of semiconductor light-emitting elements obtained from the group III-nitride laminated substrate is 10% or more.

14. A semiconductor light-emitting element comprising, as an n-type layer, a second layer included in a group III-nitride laminated substrate, the group III-nitride laminated substrate including:
   a sapphire substrate;
   a first layer that is formed on the sapphire substrate and is made of aluminum nitride; a second layer that is formed on the first layer and serves as an n-type layer made of gallium nitride and doped with an n-type dopant;
   a third layer that is formed on the second layer and serves as a light-emitting layer made of a group III-nitride; and
   a fourth layer that is formed on the third layer and serves as a p-type layer made of a group III-nitride and doped with a p-type dopant,
   wherein the second layer has a thickness of 7 μm or less, a half-value width of (0002) diffraction determined through X-ray rocking curve analysis is 100 seconds or less, and a half-value width of (10-12) diffraction determined through X-ray rocking curve analysis is 200 seconds or less.

* * * * *